(12) United States Patent
Sen et al.

(10) Patent No.: US 12,615,102 B2
(45) Date of Patent: Apr. 28, 2026

(54) CODE DESIGNS FOR NONUNIFORM SOURCES

(71) Applicant: QUALCOMM Incorporated, San Diego, CA (US)

(72) Inventors: Pinar Sen, San Diego, CA (US); Wei Yang, San Diego, CA (US); Amira Alloum, Boulogne Billancourt (FR); Jing Jiang, San Diego, CA (US); Thomas Joseph Richardson, South Orange, NJ (US)

(73) Assignee: Qualcomm Incorporated, San Diego, CA (US)

( * ) Notice: Subject to any disclaimer, the term of this patent is extended or adjusted under 35 U.S.C. 154(b) by 108 days.

(21) Appl. No.: 18/617,034

(22) Filed: Mar. 26, 2024

(65) Prior Publication Data

US 2025/0310023 A1     Oct. 2, 2025

(51) Int. Cl.
*H04L 1/00*      (2006.01)
*H03M 13/00*     (2006.01)
*H03M 13/11*     (2006.01)
*H03M 13/25*     (2006.01)

(52) U.S. Cl.
CPC ......... *H04L 1/0013* (2013.01); *H03M 13/116* (2013.01); *H03M 13/25* (2013.01); *H03M 13/6306* (2013.01); *H03M 13/6362* (2013.01); *H04L 1/0068* (2013.01)

(58) Field of Classification Search
CPC ... H04L 1/0013; H04L 1/0068; H04L 1/0041;

H04L 1/1819; H04L 1/0057; H03M 13/116; H03M 13/25; H03M 13/6306; H03M 13/6362; H03M 13/1188
See application file for complete search history.

(56) References Cited

U.S. PATENT DOCUMENTS

| | | | | |
|---|---|---|---|---|
| 2008/0320353 A1* | 12/2008 | Blankenship | ......... | H04L 1/0071 |
| | | | | 714/746 |
| 2018/0367245 A1 | 12/2018 | Soriaga et al. | | |
| 2019/0052400 A1 | 2/2019 | Soriaga et al. | | |
| 2020/0153546 A1 | 5/2020 | Nimbalker et al. | | |

(Continued)

OTHER PUBLICATIONS

M. Battaglioni, G. Greganti and G. Cancellieri, "Optimized Rate-Adaptive Error Correction Through Puncturing and Shortening of Simplex Codes," 2024 AEIT International Annual Conference (AEIT), Trento, Italy, 2024, pp. 1-6 (Year: 2024).*

(Continued)

*Primary Examiner* — Cynthia Britt
(74) *Attorney, Agent, or Firm* — Holland & Hart LLP

(57)      ABSTRACT

Methods, systems, and devices for wireless communications are described. A user equipment (UE) may generate an encoding matrix including a set of information columns including systematic bits, a first set of core parity columns including a first set of parity bits, and one or more sets of extension parity columns including a second set of parity bits. The UE may puncture one or more of the systematic bits with the first set of parity bits, the second set of parity bits, or a combination thereof, based on an offset value indicating an initial column of the encoding matrix. The UE may encode an initial message in accordance with the encoding matrix based on the offset indicating the initial column of the encoding matrix.

25 Claims, 15 Drawing Sheets

(56) References Cited

U.S. PATENT DOCUMENTS

2020/0244285 A1     7/2020   Kim et al.
2024/0405918 A1*   12/2024   Yang .................. H03M 13/616

OTHER PUBLICATIONS

M. Battaglioni, M. Baldi, F. Chiaraluce and G. Cancellieri, "Rate-Adaptive LDPC Codes Obtained from Simplex Codes," ICC 2023—IEEE International Conference on Communications, Rome, Italy, 2023, pp. 142-147 (Year: 2023).*

Partial International Search Report—PCT/US2025/019149—ISA/EPO—Jun. 20, 2025 (2401502WO).

International Search Report and Written Opinion—PCT/US2025/019149—ISA/EPO—Aug. 11, 2025 (2401502WO).

* cited by examiner

Systematic Bits

Core Parity Bits

Zero Bit Padding

Extension Bits

Extension Parity Bits

Systematic Bits

Core Parity Bits

Zero Bit Padding

Extension Bits

Extension Parity Bits

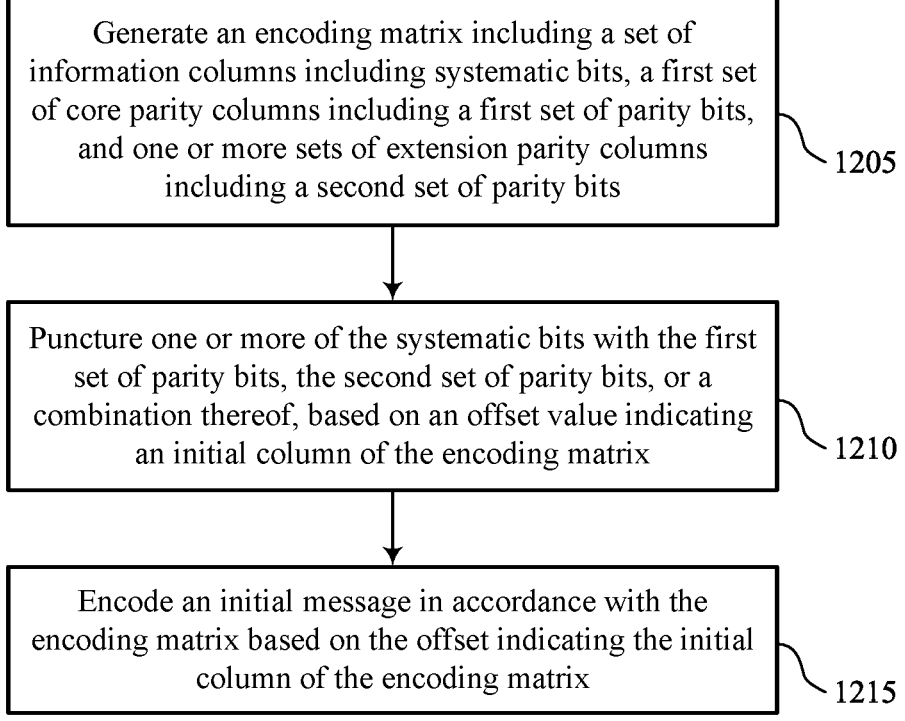

Generate an encoding matrix including a set of information columns including systematic bits, a first set of core parity columns including a first set of parity bits, and one or more sets of extension parity columns including a second set of parity bits

1205

Puncture one or more of the systematic bits with the first set of parity bits, the second set of parity bits, or a combination thereof, based on an offset value indicating an initial column of the encoding matrix

1210

Encode an initial message in accordance with the encoding matrix based on the offset indicating the initial column of the encoding matrix

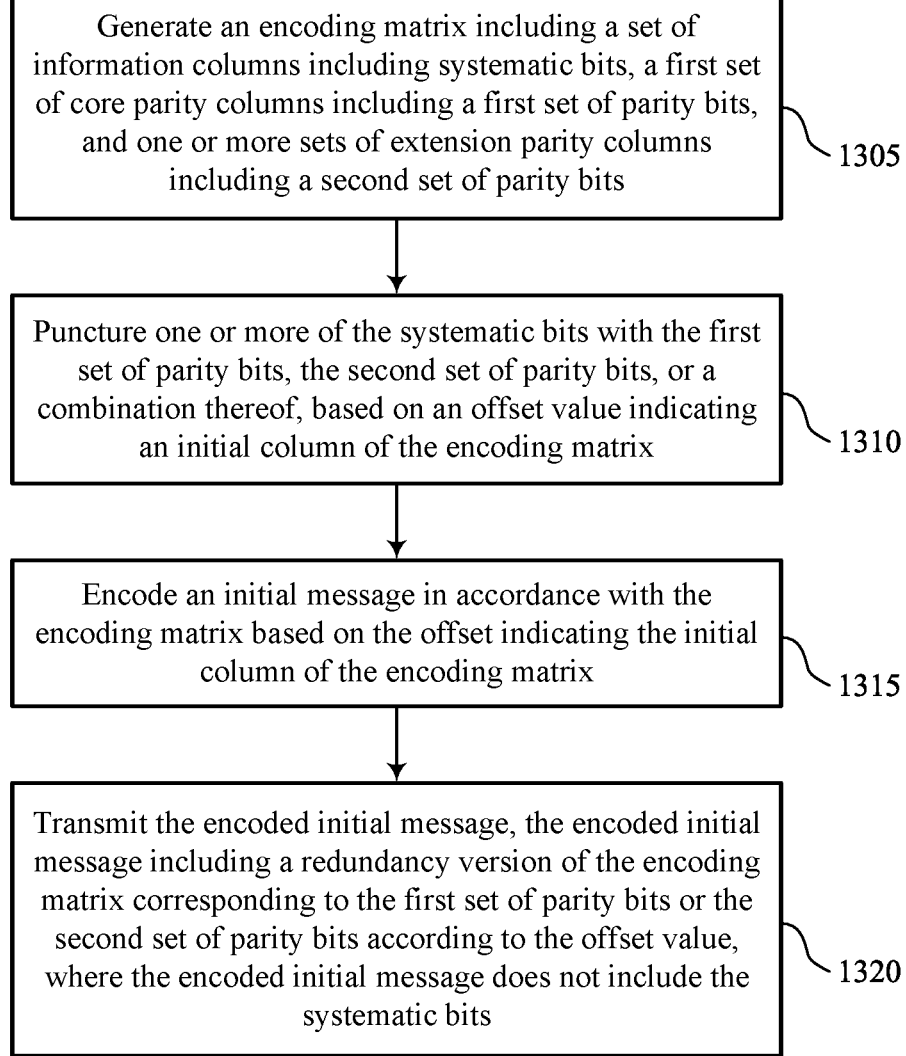

Generate an encoding matrix including a set of information columns including systematic bits, a first set of core parity columns including a first set of parity bits, and one or more sets of extension parity columns including a second set of parity bits

1305

Puncture one or more of the systematic bits with the first set of parity bits, the second set of parity bits, or a combination thereof, based on an offset value indicating an initial column of the encoding matrix

1310

Encode an initial message in accordance with the encoding matrix based on the offset indicating the initial column of the encoding matrix

1315

Transmit the encoded initial message, the encoded initial message including a redundancy version of the encoding matrix corresponding to the first set of parity bits or the second set of parity bits according to the offset value, where the encoded initial message does not include the systematic bits

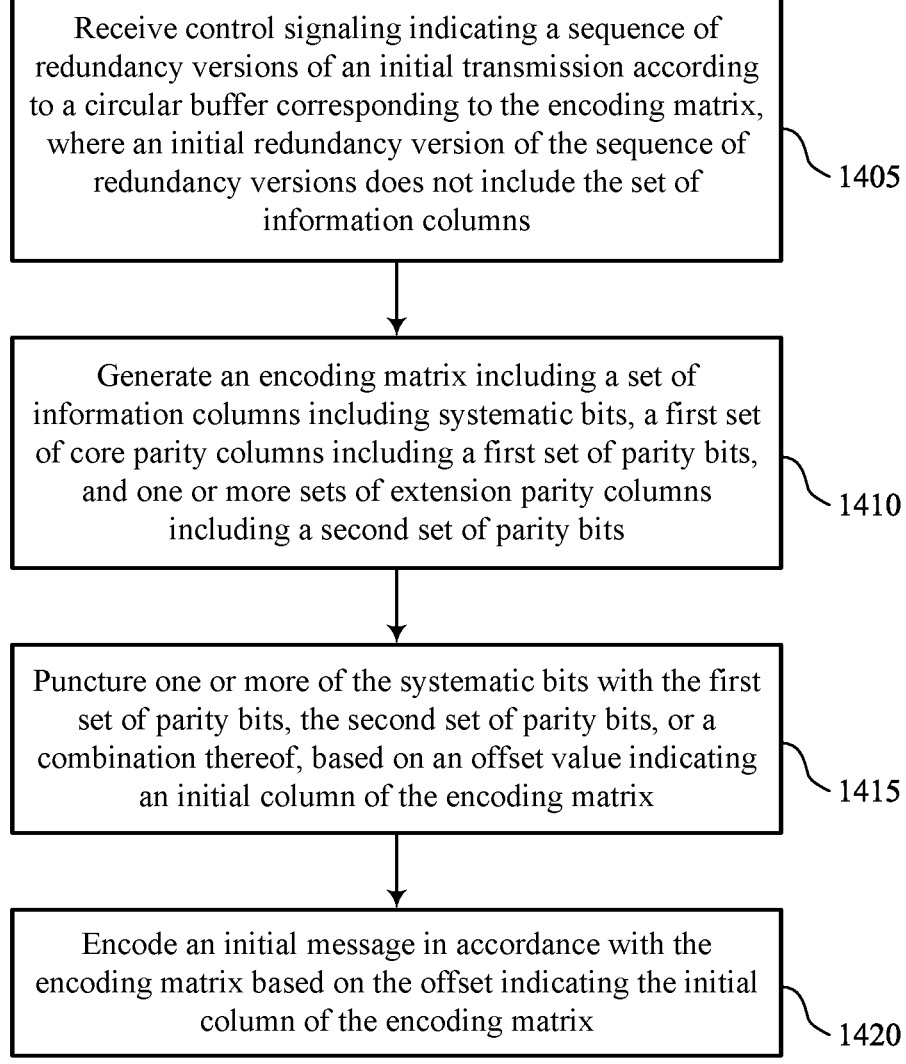

Receive control signaling indicating a sequence of redundancy versions of an initial transmission according to a circular buffer corresponding to the encoding matrix, where an initial redundancy version of the sequence of redundancy versions does not include the set of information columns                1405

Generate an encoding matrix including a set of information columns including systematic bits, a first set of core parity columns including a first set of parity bits, and one or more sets of extension parity columns including a second set of parity bits                1410

Puncture one or more of the systematic bits with the first set of parity bits, the second set of parity bits, or a combination thereof, based on an offset value indicating an initial column of the encoding matrix                1415

Encode an initial message in accordance with the encoding matrix based on the offset indicating the initial column of the encoding matrix                1420

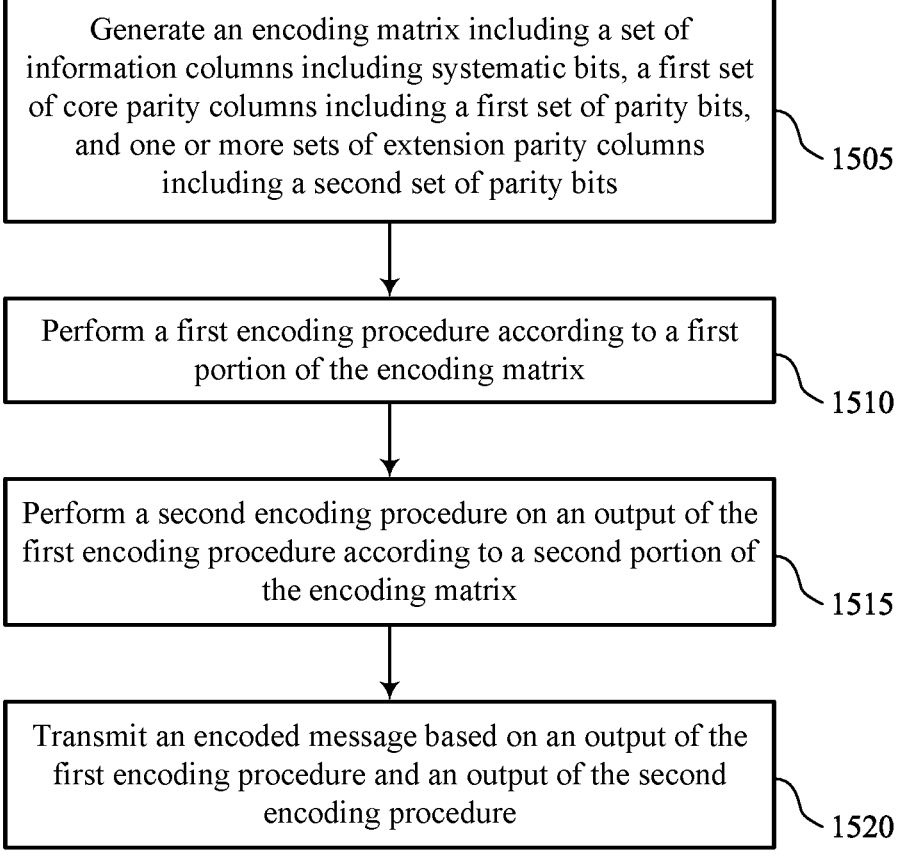

Generate an encoding matrix including a set of information columns including systematic bits, a first set of core parity columns including a first set of parity bits, and one or more sets of extension parity columns including a second set of parity bits

1505

Perform a first encoding procedure according to a first portion of the encoding matrix

1510

Perform a second encoding procedure on an output of the first encoding procedure according to a second portion of the encoding matrix

1515

Transmit an encoded message based on an output of the first encoding procedure and an output of the second encoding procedure

CODE DESIGNS FOR NONUNIFORM SOURCES

FIELD OF TECHNOLOGY

The following relates to wireless communications, including code designs for nonuniform sources.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations, each supporting wireless communication for communication devices, which may be known as user equipment (UE).

SUMMARY

The described techniques relate to improved methods, systems, devices, and apparatuses that support code designs for nonuniform sources. For example, the described techniques provide for generating, at a user equipment (UE), an encoding matrix including a set of information columns including systematic bits, a first set of core parity columns including a first set of parity bits, and one or more sets of extension parity columns including a second set of parity bits. The UE may puncture the systematic bits with the first set of parity bits, the second set of parity bits, or a combination thereof, based on an offset value indicating an initial column of the encoding matrix. The UE may encode an initial message in accordance with the encoding matrix based on the offset indicating the initial column of the encoding matrix.

A method for wireless communications by a UE is described. The method may include generating an encoding matrix including a set of information columns including systematic bits, a first set of core parity columns including a first set of parity bits, and one or more sets of extension parity columns including a second set of parity bits, puncturing one or more of the systematic bits with the first set of parity bits, the second set of parity bits, or a combination thereof, based on an offset value indicating an initial column of the encoding matrix, and encoding an initial message in accordance with the encoding matrix based on the offset indicating the initial column of the encoding matrix.

A UE for wireless communications is described. The UE may include one or more memories storing processor executable code, and one or more processors coupled with the one or more memories. The one or more processors may individually or collectively be operable to execute the code to cause the UE to generate an encoding matrix including a set of information columns including systematic bits, a first set of core parity columns including a first set of parity bits, and one or more sets of extension parity columns including a second set of parity bits, puncture one or more of the systematic bits with the first set of parity bits, the second set of parity bits, or a combination thereof, based on an offset value indicating an initial column of the encoding matrix, and encode an initial message in accordance with the encoding matrix based on the offset indicating the initial column of the encoding matrix.

Another UE for wireless communications is described. The UE may include means for generating an encoding matrix including a set of information columns including systematic bits, a first set of core parity columns including a first set of parity bits, and one or more sets of extension parity columns including a second set of parity bits, means for puncturing one or more of the systematic bits with the first set of parity bits, the second set of parity bits, or a combination thereof, based on an offset value indicating an initial column of the encoding matrix, and means for encoding an initial message in accordance with the encoding matrix based on the offset indicating the initial column of the encoding matrix.

A non-transitory computer-readable medium storing code for wireless communications is described. The code may include instructions executable by one or more processors to generate an encoding matrix including a set of information columns including systematic bits, a first set of core parity columns including a first set of parity bits, and one or more sets of extension parity columns including a second set of parity bits, puncture one or more of the systematic bits with the first set of parity bits, the second set of parity bits, or a combination thereof, based on an offset value indicating an initial column of the encoding matrix, and encode an initial message in accordance with the encoding matrix based on the offset indicating the initial column of the encoding matrix.

Some examples of the method, UEs, and non-transitory computer-readable medium described herein may further include operations, features, means, or instructions for transmitting the encoded initial message, the encoded initial message including a redundancy version (RV) of the encoding matrix corresponding to the first set of parity bits or the second set of parity bits according to the offset value, where the encoded initial message does not include the systematic bits.

Some examples of the method, UEs, and non-transitory computer-readable medium described herein may further include operations, features, means, or instructions for initiating transmission of the RV of the encoding matrix according to the puncturing and encoding, an initial bit of the RV corresponding to a first column of the first set of core parity columns.

Some examples of the method, UEs, and non-transitory computer-readable medium described herein may further include operations, features, means, or instructions for initiating transmission of the RV of the encoding matrix according to the puncturing and encoding, an initial bit of the RV including a first occurring degree one extension parity bit of the first set of parity bits or the second set of parity bits.

In some examples of the method, UEs, and non-transitory computer-readable medium described herein, the first occurring degree one extension parity bit includes a special extension parity bit connecting the initial bit of the RV to the punctured one or more systematic bits.

Some examples of the method, UEs, and non-transitory computer-readable medium described herein may further include operations, features, means, or instructions for initiating transmission of the RV of the encoding matrix according to the puncturing and encoding, an initial bit of the RV including a second occurring degree one extension parity bit of the first set of parity bits or the second set of parity bits.

In some examples of the method, UEs, and non-transitory computer-readable medium described herein, a first RV of a set of RVs of the encoding matrix corresponds to the set of information columns and the RV of the encoding matrix includes a second RV of the set of RVs that does not include the set of information columns.

In some examples of the method, UEs, and non-transitory computer-readable medium described herein, the offset value indicating the initial column of the encoding matrix may be based on an entropy of the initial message exceeding an entropy threshold and the initial column includes one of the information columns of the set of information columns, or a core parity column of the first set of core parity columns, or an extension parity column of the one or more sets of extension parity columns based on the entropy of the initial message.

Some examples of the method, UEs, and non-transitory computer-readable medium described herein may further include operations, features, means, or instructions for receiving control signaling indicating a sequence of RVs of an initial transmission according to a circular buffer corresponding to the encoding matrix, where an initial RV of the sequence of RVs does not include the set of information columns.

In some examples of the method, UEs, and non-transitory computer-readable medium described herein, a second RV of the sequence of RVs includes the set of information columns, the second RV occurring in the sequence of RVs after the first set of core parity columns and the one or more sets of extension parity columns may have been transmitted via a first RV and one or more additional RVs according to the circular buffer.

In some examples of the method, UEs, and non-transitory computer-readable medium described herein, no RVs in the sequence of RVs includes the set of information columns.

In some examples of the method, UEs, and non-transitory computer-readable medium described herein, the control signaling includes an indication of the offset value, an indication of an index of the initial column of the encoding matrix with reference to the circular buffer, an indication of a final index of the first RV with reference to the circular buffer, or any combination thereof.

Some examples of the method, UEs, and non-transitory computer-readable medium described herein may further include operations, features, means, or instructions for selecting, a subset of parity bits of the first set of parity bits, the second set of parity bits, or both, where the encoding may be based on the subset of parity bits.

In some examples of the method, UEs, and non-transitory computer-readable medium described herein, the selecting may be based on a degree of one or more check nodes associated with the subset of parity bits, an order of the set of information columns including the systematic bits, an order of the first set of core parity columns including the first set of parity bits, an order of the one or more sets of extension parity columns, or a candidate linear combination of the subset of parity bits, or any combination thereof.

In some examples of the method, UEs, and non-transitory computer-readable medium described herein, the initial column of the encoding matrix may be associated with the first set of parity bits or the second set of parity bits.

A method for wireless communications by a UE is described. The method may include generating an encoding matrix including a set of information columns including systematic bits, a first set of core parity columns including a first set of parity bits, and one or more sets of extension parity columns including a second set of parity bits, performing a first encoding procedure according to a first portion of the encoding matrix, performing a second encoding procedure on an output of the first encoding procedure according to a second portion of the encoding matrix, and transmitting an encoded message based on an output of the first encoding procedure and an output of the second encoding procedure.

A UE for wireless communications is described. The UE may include one or more memories storing processor executable code, and one or more processors coupled with the one or more memories. The one or more processors may individually or collectively be operable to execute the code to cause the UE to generate an encoding matrix including a set of information columns including systematic bits, a first set of core parity columns including a first set of parity bits, and one or more sets of extension parity columns including a second set of parity bits, perform a first encoding procedure according to a first portion of the encoding matrix, perform a second encoding procedure on an output of the first encoding procedure according to a second portion of the encoding matrix, and transmit an encoded message based on an output of the first encoding procedure and an output of the second encoding procedure.

Another UE for wireless communications is described. The UE may include means for generating an encoding matrix including a set of information columns including systematic bits, a first set of core parity columns including a first set of parity bits, and one or more sets of extension parity columns including a second set of parity bits, means for performing a first encoding procedure according to a first portion of the encoding matrix, means for performing a second encoding procedure on an output of the first encoding procedure according to a second portion of the encoding matrix, and means for transmitting an encoded message based on an output of the first encoding procedure and an output of the second encoding procedure.

A non-transitory computer-readable medium storing code for wireless communications is described. The code may include instructions executable by one or more processors to generate an encoding matrix including a set of information columns including systematic bits, a first set of core parity columns including a first set of parity bits, and one or more sets of extension parity columns including a second set of parity bits, perform a first encoding procedure according to a first portion of the encoding matrix, perform a second encoding procedure on an output of the first encoding procedure according to a second portion of the encoding matrix, and transmit an encoded message based on an output of the first encoding procedure and an output of the second encoding procedure.

In some examples of the method, UEs, and non-transitory computer-readable medium described herein, the first encoding procedure includes a low-density parity check (LDPC) corresponding to the first systematic bits and the first set of parity bits and the second encoding procedure includes a LDPC corresponding to the first systematic bits and the first set of parity bits.

In some examples of the method, UEs, and non-transitory computer-readable medium described herein, the first encoding procedure includes a low-density generator matrix (LDGM) corresponding to the second set of parity bits and the second encoding procedure includes a LDPC corresponding to the first systematic bits and the first set of parity bits.

In some examples of the method, UEs, and non-transitory computer-readable medium described herein, the first encoding procedure includes a LDPC corresponding to the first systematic bits and the first set of parity bits and the second encoding procedure includes a LDGM corresponding to the second set of parity bits.

BRIEF DESCRIPTION OF THE DRAWINGS

FIGS. 12 through 15 show flowcharts illustrating methods that support code designs for nonuniform sources in accordance with one or more aspects of the present disclosure.

DETAILED DESCRIPTION

Figure 1:
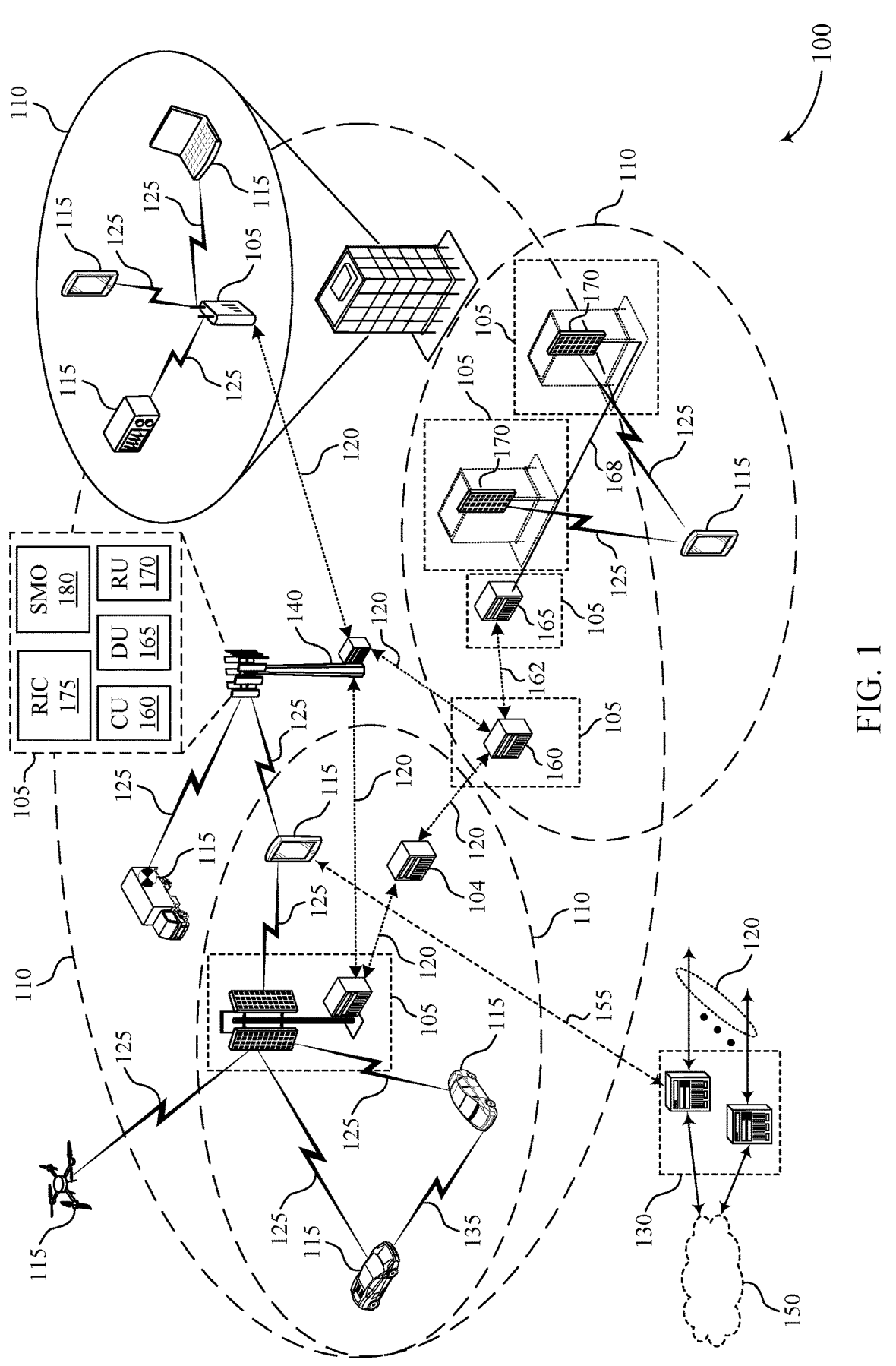
FIG. 1 shows an example of a wireless communications system that supports code designs for nonuniform sources in accordance with one or more aspects of the present disclosure.

In some wireless communications systems, a first device may encode a message using an encoding matrix (e.g., a low-density parity-check (LDPC) encoding matrix). The encoding matrix may support error detection and correction at a second device. The encoding matrix may include a set of information columns including systematic bits, a first set of core parity columns including a first set of parity bits, and one or more sets of extension parity columns including a second set of parity bits. The first device may encode the message using a circle buffer, where the buffer iterates through the columns of the encoding matrix (e.g., each index of the circular buffer may correspond to a column in the encoding matrix). In some cases, the message may have a nonuniform probability of 0-bits and 1-bits (e.g., the UE may have a higher probability of transmitting a 0-bit than a 1-bit). If the message is nonuniform (e.g., unequal 0-bits and 1-bits), a corresponding encoded message encoded with the systematic bits of the encoding matrix may also be nonuniform. The first device may transmit the nonuniform encoded message to the second device. Transmitting a nonuniform message may decrease efficient utilization of communication resources compared to a uniform message.

According to techniques described herein, the first device may encode a non-uniform message using an encoding matrix, and the first device may puncture a portion of the encoded message generated using the systematic bits of the encoding matrix. For example, the first device may encode the message based on an offset value associated with an initial column of the encoding matrix. The initial column may be associated with the first set of core parity columns or the one or more sets of extension parity columns. The first device may start encoding the message at the initial column and puncture at least some of the systematic bits. The first device may transmit the portion of the encoded message generated using the parity bits (e.g., the non-punctured portion) to the second device. By puncturing at least some of the systematic bits and encoding the message with the parity bits, the encoded message may be more uniform. Transmitting the uniform message may increase efficient utilization of communication resources compared to the non-uniform message.

In some examples, the first device may perform a first encoding procedure on the non-uniform message using a first portion of the encoding matrix (e.g., a low-density generator matrix (LDGM) or LDPC), and the first device may perform a second encoding procedure on an output from the first encoding procedure using a second portion of the encoding matrix (e.g., a corresponding LDGM or a corresponding LDPC). The second encoded message may be more uniform than the first encoded message.

Aspects of the disclosure are initially described in the context of wireless communications systems. Aspects of the disclosure are further illustrated by and described with reference to apparatus diagrams, system diagrams, and flowcharts that relate to code designs for nonuniform sources.

FIG. 1 shows an example of a wireless communications system 100 that supports code designs for nonuniform sources in accordance with one or more aspects of the present disclosure. The wireless communications system 100 may include one or more devices, such as one or more network devices (e.g., network entities 105), one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via communication link(s) 125 (e.g., a radio frequency (RF) access link). For example, a network entity 105 may support a coverage area 110 (e.g., a geographic coverage area) over which the UEs 115 and the network entity 105 may establish the communication link(s) 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be capable of supporting communications with various types of devices in the wireless communications system 100 (e.g., other wireless communication devices, including UEs 115 or network entities 105), as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, or the like may include disclosure of the UE 115, network entity 105, apparatus, device, computing system, or the like being a node. For example, disclosure that a UE 115 is configured to receive information from a network entity 105 also discloses that a first node is configured to receive information from a second node.

In some examples, network entities 105 may communicate with a core network 130, or with one another, or both. For example, network entities 105 may communicate with the core network 130 via backhaul communication link(s) 120 (e.g., in accordance with an S1, N2, N3, or other interface protocol). In some examples, network entities 105 may communicate with one another via backhaul communication link(s) 120 (e.g., in accordance with an X2, Xn, or other interface protocol) either directly (e.g., directly between network entities 105) or indirectly (e.g., via the core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication link(s) 120, midhaul communication links 162, or fronthaul communication links 168 may be or include one or more wired links (e.g., an electrical link, an optical fiber link) or one or more wireless links (e.g., a radio link, a wireless optical link), among other examples or various combinations thereof. A UE 115 may communicate with the core network 130 via a communication link 155.

One or more of the network entities 105 or network equipment described herein may include or may be referred to as a base station 140 (e.g., a base transceiver station, a radio base station, an NR base station, an access point, a radio transceiver, a NodeB, an eNodeB (eNB), a next-generation NodeB or giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within one network entity (e.g., a network entity 105 or a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among multiple network entities (e.g., network entities 105), such as an integrated access and backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU), such as a CU 160, a distributed unit (DU), such as a DU 165, a radio unit (RU), such as an RU 170, a RAN Intelligent Controller (RIC), such as an RIC 175 (e.g., a Near-Real Time RIC (Near-RT RIC), a Non-Real Time RIC (Non-RT RIC)), a Service Management and Orchestration (SMO) system, such as an SMO system 180, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more of the network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 170 is flexible and may support different functionalities depending on which functions (e.g., network layer functions, protocol layer functions, baseband functions, RF functions, or any combinations thereof) are performed at a CU 160, a DU 165, or an RU 170. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaptation protocol (SDAP), Packet Data Convergence Protocol (PDCP)). The CU 160 (e.g., one or more CUs) may be connected to a DU 165 (e.g., one or more DUs) or an RU 170 (e.g., one or more RUs), or some combination thereof, and the DUs 165, RUs 170, or both may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or multiple different RUs, such as an RU 170). In some cases, a functional split between a CU 160 and a DU 165 or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to a DU 165 via a midhaul communication link 162 (e.g., F1, F1-c, F1-u), and a DU 165 may be connected to an RU 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities (e.g., one or more of the network entities 105) that are in communication via such communication links.

In some wireless communications systems (e.g., the wireless communications system 100), infrastructure and spectral resources for radio access may support wireless backhaul link capabilities to supplement wired backhaul connections, providing an IAB network architecture (e.g., to a core network 130). In some cases, in an IAB network, one or more of the network entities 105 (e.g., network entities 105 or IAB node(s) 104) may be partially controlled by each other. The IAB node(s) 104 may be referred to as a donor entity or an IAB donor. A DU 165 or an RU 170 may be partially controlled by a CU 160 associated with a network entity 105 or base station 140 (such as a donor network entity or a donor base station). The one or more donor entities (e.g., IAB donors) may be in communication with one or more additional devices (e.g., IAB node(s) 104) via supported access and backhaul links (e.g., backhaul communication link(s) 120). IAB node(s) 104 may include an IAB mobile termination (IAB-MT) controlled (e.g., scheduled) by one or more DUs (e.g., DUs 165) of a coupled IAB donor. An IAB-MT may be equipped with an independent set of antennas for relay of communications with UEs 115 or may share the same antennas (e.g., of an RU 170) of IAB node(s) 104 used for access via the DU 165 of the IAB node(s) 104 (e.g., referred to as virtual IAB-MT (vIAB-MT)). In some examples, the IAB node(s) 104 may include one or more DUs (e.g., DUs 165) that support communication links with additional entities (e.g., IAB node(s) 104, UEs 115) within the relay chain or configuration of the access network (e.g., downstream). In such cases, one or more components of the disaggregated RAN architecture (e.g., the IAB node(s) 104 or components of the IAB node(s) 104) may be configured to operate according to the techniques described herein.

In the case of the techniques described herein applied in the context of a disaggregated RAN architecture, one or more components of the disaggregated RAN architecture may be configured to support test as described herein. For example, some operations described as being performed by a UE 115 or a network entity 105 (e.g., a base station 140) may additionally, or alternatively, be performed by one or more components of the disaggregated RAN architecture (e.g., components such as an IAB node, a DU 165, a CU 160, an RU 170, an RIC 175, an SMO system 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, vehicles, or meters, among other examples.

The UEs 115 described herein may be able to communicate with various types of devices, such as UEs 115 that may sometimes operate as relays, as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via the communication link(s) 125 (e.g., one or more access links) using resources associated with one or more carriers. The term "carrier" may refer to a set of RF spectrum resources having a defined PHY layer structure for supporting the communication link(s) 125. For example, a carrier used for the communication link(s) 125 may include a portion of an RF spectrum band (e.g., a bandwidth part (BWP)) that is operated according to one or more PHY layer channels for a given RAT (e.g., LTE, LTE-A, LTE-A Pro, NR). Each PHY layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities, such as one or more of the network entities 105).

Signal waveforms transmitted via a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both), such that a relatively higher quantity of resource elements (e.g., in a transmission duration) and a relatively higher order of a modulation scheme may correspond to a relatively higher rate of communication. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

The time intervals for the network entities 105 or the UEs 115 may be expressed in multiples of a basic time unit which may, for example, refer to a sampling period of $T_s = 1/(\Delta f_{max} \cdot N_f)$ seconds, for which $\Delta f_{max}$ may represent a supported subcarrier spacing, and $N_f$ may represent a supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively-numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems, such as the wireless communications system 100, a slot may further be divided into multiple mini-slots associated with one or more symbols. Excluding the cyclic prefix, each symbol period may be associated with one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (STTIs)).

Physical channels may be multiplexed for communication using a carrier according to various techniques. A physical control channel and a physical data channel may be multiplexed for signaling via a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to UEs 115 (e.g., one or more UEs) or may include UE-specific search space sets for sending control information to a UE 115 (e.g., a specific UE).

In some examples, a network entity 105 (e.g., a base station 140, an RU 170) may be movable and therefore provide communication coverage for a moving coverage area, such as the coverage area 110. In some examples, coverage areas 110 (e.g., different coverage areas) associ-ated with different technologies may overlap, but the coverage areas 110 (e.g., different coverage areas) may be supported by the same network entity (e.g., a network entity 105). In some other examples, overlapping coverage areas, such as a coverage area 110, associated with different technologies may be supported by different network entities (e.g., the network entities 105). The wireless communications system 100 may include, for example, a heterogeneous network in which different types of the network entities 105 support communications for coverage areas 110 (e.g., different coverage areas) using the same or different RATs.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be configured to support communicating directly with other UEs (e.g., one or more of the UEs 115) via a device-to-device (D2D) communication link, such as a D2D communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by (e.g., scheduled by) the network entity 105. In some examples, one or more UEs 115 of such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to one or more of the UEs 115 in the group. In some examples, a network entity 105 may facilitate the scheduling of resources for D2D communications. In some other examples, D2D communications may be carried out between the UEs 115 without an involvement of a network entity 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. UHF waves may be blocked or redirected by buildings and environmental features, which may be referred to as clusters, but the waves may penetrate structures sufficiently for a macro cell to provide service to the UEs 115 located indoors. Communications using UHF waves may be associated with smaller antennas and shorter ranges (e.g., less than one hundred kilometers) compared to communications using the smaller frequencies and longer waves of the high frequency (HF) or very high frequency (VHF) portion of the spectrum below 300 MHz.

The wireless communications system 100 may utilize both licensed and unlicensed RF spectrum bands. For example, the wireless communications system 100 may employ License Assisted Access (LAA), LTE-Unlicensed (LTE-U) RAT, or NR technology using an unlicensed band such as the 5 GHz industrial, scientific, and medical (ISM) band. While operating using unlicensed RF spectrum bands, devices such as the network entities 105 and the UEs 115 may employ carrier sensing for collision detection and avoidance. In some examples, operations using unlicensed bands may be based on a carrier aggregation configuration in conjunction with component carriers operating using a licensed band (e.g., LAA). Operations using unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located at diverse geographic locations. A network entity 105 may include an antenna array with a set of rows and columns of antenna ports that the network entity 105 may use to support beamforming of communications with a UE 115. Likewise, a UE 115 may include one or more antenna arrays that may support various MIMO or beamforming operations. Additionally, or alternatively, an antenna panel may support RF beamforming for a signal transmitted via an antenna port.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating along particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

The UEs 115 and the network entities 105 may support retransmissions of data to increase the likelihood that data is received successfully. Hybrid automatic repeat request (HARQ) feedback is one technique for increasing the likelihood that data is received correctly via a communication link (e.g., the communication link(s) 125, a D2D communication link 135). HARQ may include a combination of error detection (e.g., using a cyclic redundancy check (CRC)), forward error correction (FEC), and retransmission (e.g., automatic repeat request (ARQ)). HARQ may improve throughput at the MAC layer in relatively poor radio conditions (e.g., low signal-to-noise conditions). In some examples, a device may support same-slot HARQ feedback, in which case the device may provide HARQ feedback in a specific slot for data received via a previous symbol in the slot. In some other examples, the device may provide HARQ feedback in a subsequent slot, or according to some other time interval.

In some wireless communications systems, a first device (e.g., a UE 115 or a network entity 105) may transmit a non-uniform message (e.g., a message including a inequal proportion of 1-bits and 0-bits) to a second device (e.g., a UE 115 or a network entity 105). For example, the first device may transmit HARQ feedback. A nonuniform probability of messages may appear in HARQ feedback communication scenarios. The first device may transmit an acknowledgment (ACK) or a negative acknowledgment (NACK), where an ACK (e.g., bit 0) may be more likely than NACK (e.g., bit 1). In other words, the first device may indicate an acknowledgment of a received message by setting a corresponding feedback bit to 0 (e.g., ACK), and the first device may indicate an error in receiving or decoding a message by setting a corresponding feedback bit to 1 (e.g., NACK). In some cases, the first device may be more likely to transmit an ACK compared to a NACK. For example, at a 10% block error rate (BLER) in PDSCH (e.g., 10% of code blocks associated with PDSCH transmissions may contain errors) may correspond to a 10% NACK probability and a 90% ACK probability. In other words, the first device may transmit approximately 10% 1-bits and 90% 0-bits based on the BLER of 10%. In HARQ feedback communications, the second device may schedule one or more messages (e.g., downlink messages) and the first device may transmit HARQ feedback for the one or more messages. For example, the second device may schedule four downlink transmissions (e.g., PDSCH). The first device may send a 4-bit message for HARQ ACK/NACK (e.g., HARQ feedback) based on the decoding of the downlink transmissions. In some cases, channel state information (CSI) may be similar to HARQ-ACK (e.g., the distribution of caching and downlink resource sharing optimization framework (CSF) bits may be non-uniform).

In some examples, the first device may transmit a non-uniform message including semantic data communications (e.g., semantic data communications for transmission of speech or images). The message may include residual redundancy, and the message may be non-uniform based on the residual redundancy.

Additionally, or alternatively, the first device may transmit a non-uniform message based on a conditional distribution of the first device given a side information at the second device. In many applications, the second device may already have side information about the first device, which can be exploited at the second device to facilitate decoding. That is, the message may be non-uniform based on the side information at the second device even if the raw distribution at the first device may be uniform.

In some cases, an output from the first device may be modeled with a Bernoulli distribution (e.g., a sequence of an independent and identically distributed (i.i.d.) Bern(p) information bits).

$$\{b_i\}_{i=0}^{n-1}$$

For example, when p=0.11, the entropy H(0.11) may be 0.5. In the uniform i.i.d. case, p=0.5, the entropy H(0.5) may be 1.

According to techniques described herein, the first device may encode a non-uniform message using an encoding matrix, and the first device may puncture a portion of the encoded message generated using the systematic bits of the encoding matrix. For example, the first device may encode the message based on an offset value associated with an initial column of the encoding matrix. The initial column may be associated with the first set of core parity columns or the one or more sets of extension parity columns. The first device may start encoding the message at the initial column and puncture one or more of the systematic bits. The first device may transmit the portion of the encoded message generated using the parity bits (e.g., the non-punctured portion) to the second device. By puncturing the systematic bits and encoding the message with the parity bits, the encoded message may be more uniform (e.g., when compared to the non-uniform information in the unencoded message). Transmitting the uniform encoded message may increase efficient utilization of communication resources compared to the unencoded non-uniform message.

In some examples, the first device may perform a first encoding procedure on the non-uniform message using a first portion of the encoding matrix (e.g., a LDGM or LDPC), and the first device may perform a second encoding procedure on an output from the first encoding procedure using a second portion of the encoding matrix (e.g., a corresponding LDGM or a corresponding LDPC). The second encoded message may be more uniform than the first encoded message.

Figure 2:
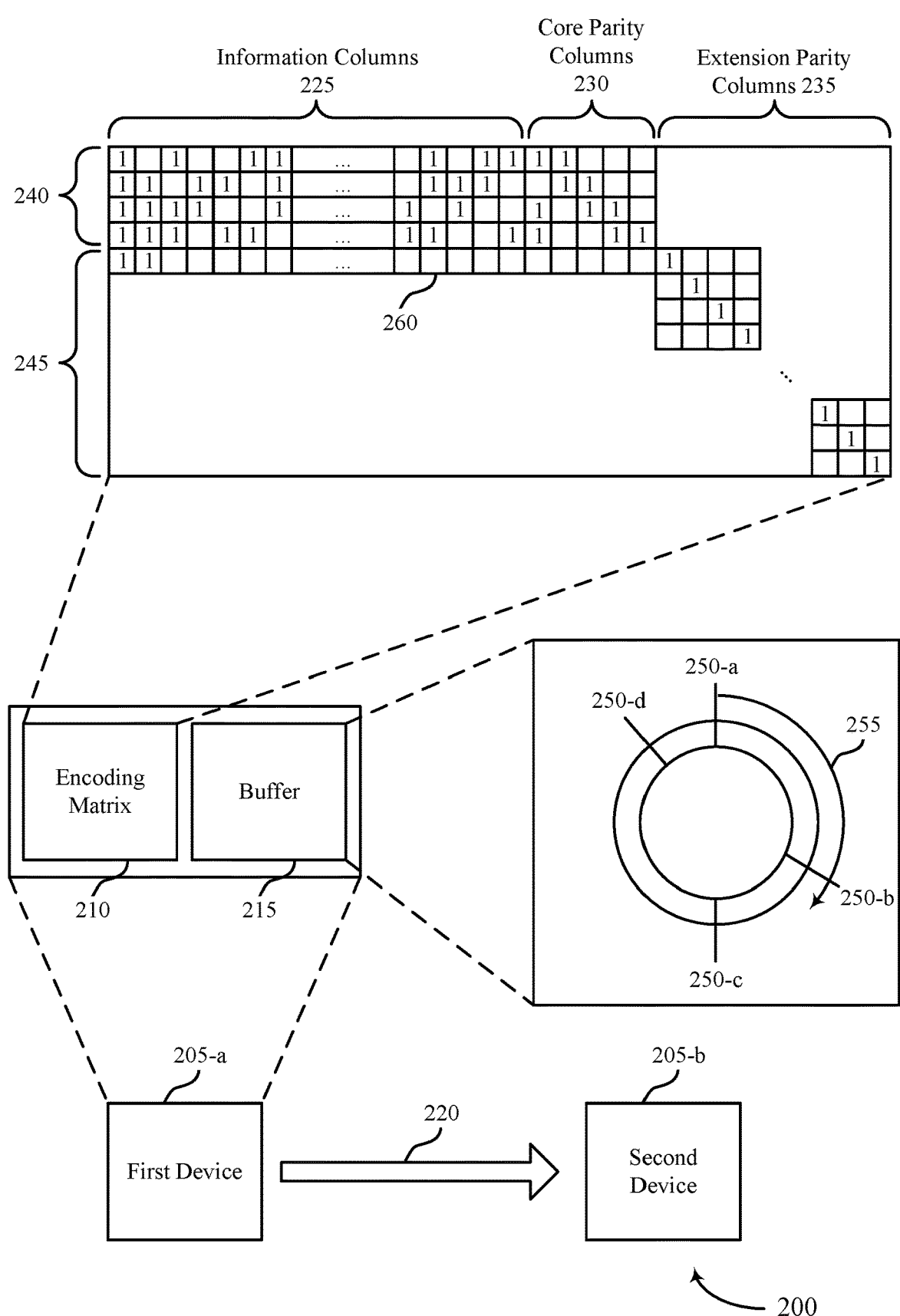
FIG. 2 shows an example of a wireless communications system that supports code designs for nonuniform sources in accordance with one or more aspects of the present disclosure.

FIG. 2 shows an example of a wireless communications system 200 that supports code designs for nonuniform sources in accordance with one or more aspects of the present disclosure. In some examples, wireless communications system 200 may implement aspects of wireless communications system 100. For example, a first device 205-a and a second device 205-b may represent an example of a UE, such as the UEs 115 described with reference to FIG. 1 or a network entity, such as the network entity 105 described with reference to FIG. 1. The first device may utilize an encoding matrix 210 and may include a buffer 215 (e.g., a circular buffer). In some cases, the second device may utilize an encoding matrix 210 and a buffer 215, or a decoder based on the encoding matrix 210 (not shown). The first device 205-a may communicate to the second device 205-b via the communications channel 220.

The first device may generate the encoding matrix 210 and encode a first message in accordance with an LDPC encoding procedure. The encoding matrix 210 may include a set of information columns 225 including systematic bits, a set of core parity columns 230 including a first set of parity bits, and one or more sets of extension parity columns 235 including a second set of parity bits. A core matrix of the encoding matrix 210 may include the set of information columns 225 and the set of core parity columns 230 in the core check rows 240. The core matrix may be used for encoding at a high code rate. The extension parity columns 235 may include an identity matrix structure in the extension rows 245. The extension rows 245 may include a first degree-one extension (e.g., a first extension row). The first degree-one extension may be a special extension bit. The extension parity columns 235 may be connected to the information columns 225 or the core parity columns 230. In some cases, an extension parity columns may not be connected to another extension parity column (e.g., another extension parity node). For example, the first device 205-a may generate a first encoded message (e.g., a redundancy version (RV) 0) of a first message using the core matrix at a first code rate. For a retransmission of the first message, the first device 205-a may generate a second encoded message (e.g., RV1) of the first message using the extended part of the encoding matrix 210 (e.g., the extension parity columns 235 or the extension rows 245) at a second code rate lower than the first code rate. The first device 205-a may combine the first encoded message and the second encoded message (e.g., provide more parity bits). In some examples, each additional retransmission may include an additional part (e.g., extension parity column 235 or extension row 245) and an increased quantity of parity bits.

An encoded message (e.g., RV0 or RV1) may be associated with an initial column of the encoding matrix. For example, the first encoded message may be associated with a first column (e.g., a start column of the encoding matrix 210) in the set of information columns 225. The second encoded message may be associated with a second column (e.g., column 260) in the set of information columns 225. In some cases, the second column may be associated with a larger index value than the first column. A third encoded message (e.g., RV2 or a second retransmission of the first message generated at the first device 205-a) may be associated with a third column in the set of core parity columns 230.

The circular buffer 215 may include indexes 250 associated with initial columns (e.g., for respective RVs or retransmissions) of the encoding matrix 210. For example, index 250-a may be associated with the first column in the set of information columns 225 associated with the first encoded message (e.g., RV0). If the initial column of the first encoded message (e.g., RV0) is indicated to be the first column (e.g., the starting column located farthest to the left of the information columns 225) of the information columns 225, then the first bits of the first encoded message may include systematic bits in the range 255 of the first information column of the information columns 225. The index 250-b may be associated with the second column in the set of information columns 225 associated with second encoded message (e.g., RV1). The index 250-c may be associated with the third column in the set of core parity columns 230 associated with the third encoded message (e.g., RV2). The index 250-d may be associated with a fourth column in the set of extension parity columns 235 associated with a fourth encoded message (e.g., RV3). The range 255 may be represent the indexes 250 in the buffer 215 associated with the information columns 225. For example, the first encoded message associated with the index 250-*a* may be associated with indexes 250 including index 250-*a* (e.g., an index 250 associated with the start column of the encoding matrix 210) and up to index 250-*b* (e.g., an index 250 associated with the column 260 of the information columns 225). The indexes 250 including index 250-*a* and up to index 250-*b* may all be associated with the information columns of the encoding matrix 210 (e.g., columns of the encoding matrix 210 between the start column and the column 260 are all columns in the set of information columns 225). The second encoded message associated with the index 250-*b* may be associated with indexes 250 including index 250-*b* (e.g., an index 250 associated with the column 260) and up to index 250-*c* (e.g., an index 250 associated with one of the core parity columns 230 or the extension parity columns 235).

In some cases, the first device 205-*a* may generate the encoding matrix 210 based on a non-uniform message for transmission to the second device 205-*b*. The first device 205-*a* may encode the non-uniform message using the encoding matrix 210. For an initial transmission, the encoded message may be associated with RV0. That is, the first device 205-*a* may generate a first encoded message based on the systematic bits associated with the information columns 225. The systematic bits may be non-uniform based on the non-uniform message, and the first encoded message may be non-uniform based on the non-uniform systematic bits. The first device 205-*a* may transmit the first non-uniform encoded message via the communications channel 220. The non-uniformity of the first encoded message may cause performance loss on the channel 220. For example, some encoding (e.g., and corresponding decoding) procedures may be based on an underlying assumption that 0 bits and 1 bits are equally likely, and may therefore experience degradation or failure if the source is non-uniform. For instance, communications via the communications channel 220 may be degraded if an assumption of uniform bits is false, and the channel capacity may decrease when the first device transmits a non-uniform message.

The communications channel 220 may be symmetric and a channel profile associated with the communications channel 220 may be a Gaussian distribution (e.g., a distribution symmetric around zero). The non-uniform bits may map to a modulation scheme unevenly. The uneven mapping may create an asymmetric input distribution, which may reduce the channel capacity for a symmetric channel (e.g., an additive white Gaussian noise (AWGN) channel).

According to techniques described herein, the first device 205-*a* and the second device 205-*b* may utilize a coding procedure (e.g., such as an LDPC coding procedure) associated with non-uniform messages to generate an encoded message that is uniform (e.g., based on a coding matrix 210 generated from a non-uniform unencoded message). In some cases, an LDPC code may be an example of an LDGM structure (e.g., an LDPC+degree-1 extension). That is, the encoding matrix 210 may be associated with an LDPC code.

In some cases, in order to generate an encoded uniform message while mitigating the non-uniformity of a non-encoded message associated with a non-uniform message, the first device 205-*a* may transmit the parity portion of the encoding matrix 210 (e.g., the code) as the initial transmission, and the first device 205-*a* may puncture some or all of the systematic bits from the initial transmission. The parity part of the encoded matrix 210 may be more uniform based on modular two summations used to generate the parity bits.

The first device may transmit the initial transmission generated using the parity portion of the encoded matrix 210 via the communications channel 220. The increased uniformity may increase the channel capacity associated with the communications channel 220. That is, the initial transmission may be using a special RV (e.g., RV2). The first transmission (e.g., instead of RV0, which includes or starts with the systematic bits) may be the special or different RV (e.g., an encoded message associated with a second retransmission of the non-uniform message beginning with or including parity bits). RV2 may start from a half position of the encoding matrix (e.g., RV2 may be associated with the third column in the set of core parity columns 230).

In some examples, to generate the initial transmission, the first device may encode the non-uniform message using one or more of the columns associated with RV0, RV1, and RV2 (e.g., columns associated with index 250-*a* through index 250-*d*). The first device may puncture the bits associated with RV0 and RV1. That is, the first device 205-*a* may puncture all of the systematic bits, or the first device 205-*a* may puncture all of the systematic bits and some of the parity bits (e.g., the core parity bits associated with RV1), and may instead transmit (e.g., as a starting column of the encoded message) parity bits. For example, the first device 205-*a* may transmit the parity part of the code as the initial transmission, and may puncture the systematic bits (e.g., may transmit parity bits instead of systematic bits at the beginning of the encoded message).

In some cases, the initial transmission may be based on a new or specialized RV. In such examples, the initial transmission (e.g., the specialized RV) may begin from a half position (e.g., a non-starting position) of the code (e.g., beginning from a column other than the starting column of the information columns 225). In some examples, the new RV may start from the first parity bit in the base graph or the lifted graph (e.g., the first parity bit included in the core parity columns 230, or the first parity bit included in the extension parity columns). The new RV may start from a first degree-one extension (e.g., a first row of the extension rows 245). The new RV may start from a second degree-one extension (e.g., in case the first degree-one extension is a special extension bit, which is the sum of the two punctured nodes).

For example, an initial core parity column 230 may be associated with an index 250 in the circular buffer 215 after the range 255 (e.g., such that a starting bit for the encoded message is a parity bit, and not a systematic bit). An index 250 may indicate a first non-systematic column (e.g., a column associated with an index value of 21 occurring immediately after the last column in the set of information columns 225, such as a starting column of the core parity columns 230 or a starting column of the extension parity columns 235). An index 250 in the circular buffer 215 may be associated with the first degree-one extension (e.g., the first extension row of the extension rows 245) including the special parity bit (e.g., a column associated with an index value of 25, where the column is of the encoding matrix 210). An index 250 in the circular buffer 215 may be associated with the first degree-one extension excluding the special parity bit (e.g., the second extension row of the extension rows 245, where the first degree-1 one extension corresponds to, for instance, a column associated with an index value of 26). In some cases, the new RV is linked to a new data indicator (NDI) associated with the non-uniform message (e.g., because parities of the initial transmission are transmitted, instead of the initial transmission).

In some examples, the new or special RV may be any RV that is different from the initial RV, or does not included any systematic bits. For instance, index 250-b may indicate a first column of RV 1 (e.g., a column associated with an index value of 16), which may be included in the systematic bits (e.g., may be one of the information columns of the set of information columns 225). However, because index 250-b is located within the range 255, at least a portion of RV1 may include systematic bits. Index 250-c may indicate a starting column of RV2 (e.g., a column associated with an index value of 32), which may fall outside of the range 255 (e.g., in which case no bits in RV2 are systematic bits). Thus, in some examples, RV2 may puncture RV0, such that only parity bits are transmitted in the initial transmission (e.g., and only parity bits corresponding to column 33 and subsequent columns are transmitted).

In some examples, the portion of the systematic bits and parity bits used for encoding an initial message may be based on the source entropy (e.g., the entropy associated with one or more messages at the first device 205-a). If source entropy is high, the first device may allow a portion of the systematic bit to be transmitted. For example, the first device may transmit an initial transmission associated with RV1, which includes indexes 250 associated with both information columns and parity columns. For example, when the source entropy is high (e.g., the initial message is uniform or almost uniform), transmitting parity bits (e.g., and no systematic bits) may cause the transmission to not be self-decodable. For instance, there may be a threshold source entropy (e.g., around H(p)=0.7 as described with reference to FIG. 1), above which the non-systematic LDPC will not be self-decodable. Instead, if source entropy is high, an initial transmission may include some systematic bits and some parity bits (e.g., not all systematic bits may be punctured by the initial transmission).

Additionally, or alternatively, the first device 205-a may transmit an alternative instance of the nonsystematic LDPC of a message. For example, the first device 205-a may generating new parities. In some examples, the first device 205-a may encode the initial message based on a linear combinations of columns of the encoding matrix 210. In some examples, the first device may select another instance of non-systematic LDPC or LDGM subcode that demonstrate decoding convergence in the related source entropy region. In some examples, the first device 205-a may generate new or additional code (e.g., new nodes of an encoding matrix 210), may perform linear combinations of all columns (e.g., including the additional code), may select subcodes, or any combination, to generate the encoded message based partially or entirely on parity bits.

For transmissions with repetitions, or HARQ retransmissions, the repetitions or transmissions may correspond to a RV sequence which starts from the non-systematic RV (e.g., the repetitions may start with RV2). The repetition may rotate back to the systematic RV (e.g., RV0) according to the sequence in later repetitions, after all parity bits have been transmitted. Additionally, or alternatively, the first device 205-a may avoid the systematic bits for all repetitions or RVs according to the sequence. For example, the systematic bits may be treated as punctured bits for all RVs (e.g., and RV 0 may not be transmitted or include in the sequence at all). The RV sequence may be configured by the network (e.g., via control signaling received from the second device 205-b). In some examples, the RV sequence may be indicated for configured grant transmissions or for transmission with repetitions (e.g., via control signaling including grants for such transmissions, such as DCI messages). If the indexes 250 (e.g., positions) in the circular buffer are consecutive or contiguous, the second device 205-b may indicate a shift or the last index to the first device 205-a. For instance, control signaling indicating the RV sequence may include an indication of an offset or a shift (e.g., an offset of a quantity of columns such that a first column of a first RV does not include systematic bits), a last index (e.g., a final index included in the sequence), or a combination thereof.

In some examples, a subset of the parity bits may be selected for transmission (e.g., a subset of non-contiguous parity bits in the encoding matrix 210) or a linear combination of the parity bits. In some cases, the first device may choose to transmit parity bits that are connected to check nodes with higher degrees. The first device 205-a may choose the higher degrees based on the low check degree not yielding a sufficient uniform distribution on the parity bits. In some cases, the first device may permute the order of columns for the encoding matrix 210, such that parity nodes that are connected to check nodes with higher degrees will appear first. In some cases, the first device may transmit a linear combination of a subset of parity bits. A selected construction may be found empirically by evaluating different subcodes or subgraphs based on design criteria for LDPC graph construction and the value of the source entropy. In some cases, the selected construction may not be associated with check nodes of higher degrees.

In some examples, as described in greater detail with reference to FIGS. 3-5 and 7, a transmitting device (e.g., the first device 205-a) may perform a concatenation of a first portion of a code (e.g., an LDGM part of a code) and a second portion of the same code (e.g., an LDPC portion of the code). That is, the transmitting device may reuse a same code to do both LDPC encoding and LDGM encoding. The two portions of the same code may be utilized as an inner code and an outer code (e.g., back to back encoding). Parity bit generation and usage for LDGM encoding may be performed autonomously, according to one or more rules, or based on techniques described herein (e.g., with reference to FIG. 2).

Figure 3:
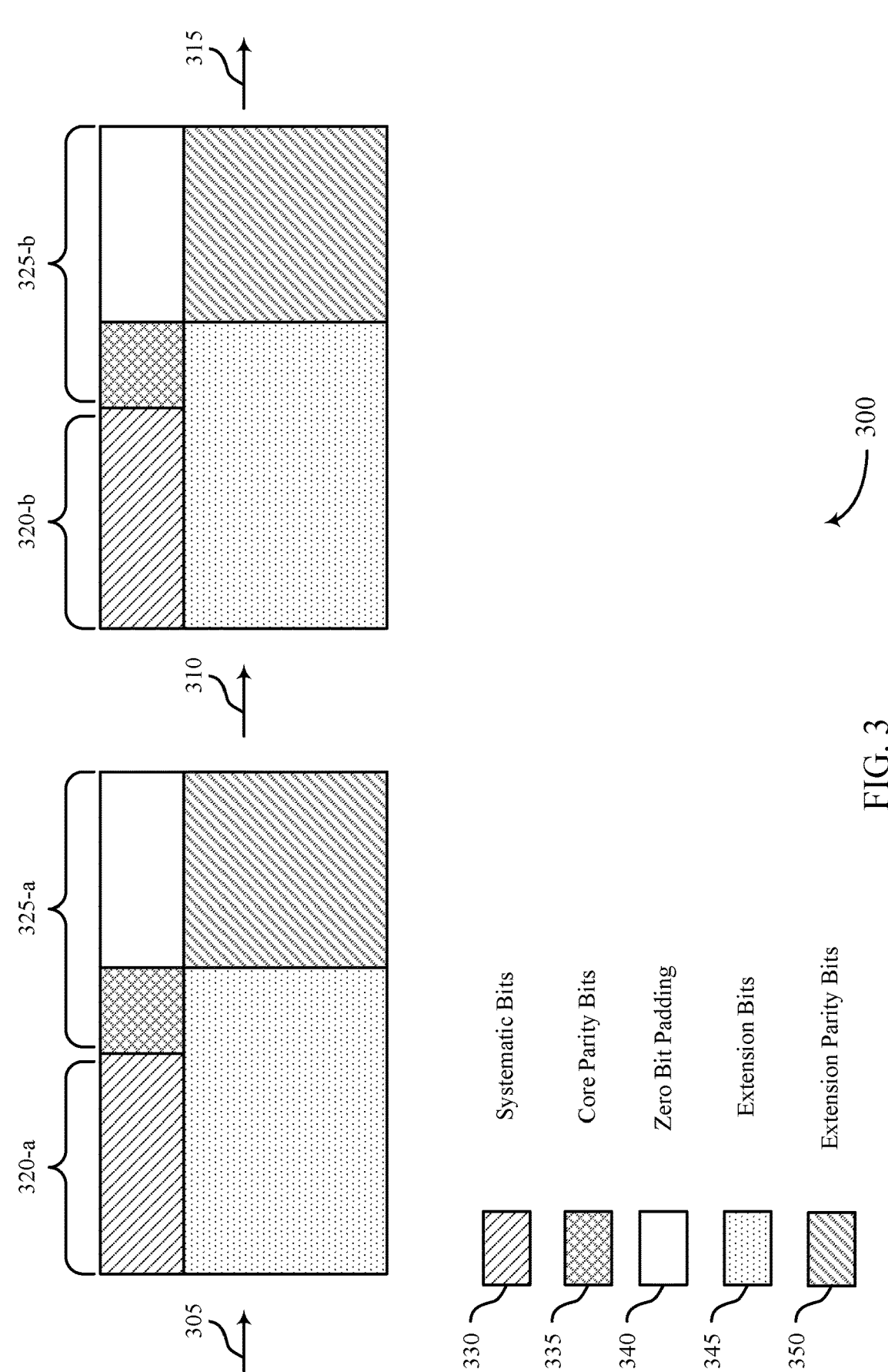
FIG. 3 shows an example of a encoding scheme that supports code designs for nonuniform sources in accordance with one or more aspects of the present disclosure.

FIG. 3 shows an example of a encoding scheme 300 that supports code designs for nonuniform sources in accordance with one or more aspects of the present disclosure. The encoding schemes may be performed by a first device (e.g., the first device 205-a as described with reference to FIG. 2). The code (e.g., an LDPC code) may include systematic bits 330, core parity bits 335, zero bit padding 340, extension bits 345, and extension parity bits 350. In some cases, a first set of columns 320-a may correspond to a sub matrix $H_S$, and a second set of columns 325-a may correspond to a sub matrix $P_u$. In some cases, a third set of columns 320-b may correspond to the sub matrix $H_s$, and a fourth set of columns 325-b may correspond to a sub matrix $P_u$.

In some cases, in order to reduce the non-uniformity of an encoded message associated with a non-uniform message, the first device may perform two encoding procedure using the same code (e.g., multiple portions of the same encoding matrix) on a non-uniform message. Performing the two encoding procedures may create a non-systematic LDPC encoding procedure. For example, the first device may concatenate a LDGM matrix associated with an LDPC code and the LDPC code. The first device may reuse the same code (e.g., NR Code, among other examples) to do the LDPC and LDGM encoding procedure. That is, the first device may use two portions of a same encoding matrix for the two encoding procedures. The first encoding procedure may be an inner code and the second encoding procedure may be an outer code. The first device may perform the first encoding procedure and the second encoding procedure back to back.

In some cases, the first encoding procedure may include an LDPC code and the second encoding procedure may include the same LDPC code (e.g., as described in greater detail with reference to FIG. 3). In some cases, the first device may use the same or different subcodes of LDPC. In some cases, the first encoding procedure may include an LDGM associated with an LDPC code and the second encoding procedure may include the LDPC code (e.g., as described in greater detail with reference to FIG. 4). In other words, the first encoding procedure and the second encoding procedure may be associated with different portions of an encoding matrix corresponding to the same code. In some cases, the first encoding procedure may include an LDPC code and the second encoding procedure may include a LDGM associated with the same LDPC code (e.g., as described in greater detail with reference to FIG. 5). In some cases, the first or second encoding procedure may choose parity bits for an LDGM.

For example, FIG. 3 may illustrate a first encoding procedure associated with an LDPC code and a second encoding procedure associated with the same LDPC code. The first device may encode a message 305 (e.g., which may be referred to as an input s) into a first encoded message 310 (e.g., which may be referred to as an output u) based on the respective portion of the LDPC code. The message 305 may correspond to the first set of columns 320-*a* and the first encoded message 310 may correspond to a second set of columns 325-*a* (e.g., $P_u*u=H_s*S$). The first device may encode the first encoded message 310 into the second encoded message 315 (e.g., which may be referred to as an output v, such that the transmitting devices sends a transmission defined as Transmit (u, v)) based on the respective portion of the LDPC code. The first encoded message 310 may correspond to the third set of columns 320-*b* and the second encoded message 315 may correspond to the fourth set of columns 325-*b* (e.g., $P_u*v=H_s*u$). In some cases, the first set of columns 320-*a* and third set of columns 320-*b* may be the same set of columns 320, and the second set of columns 325-*a* and fourth set of columns 325-*b* may be the same set of columns 325. The first device may transmit the first encoded message 310 and the second encoded message 315 to the second device (e.g., may send Transmit (u, v)). In some cases, the second device may first decode the first encoded message 310 and then decode the message 305. In some cases, the second device may directly decode the message 305 using an equivalent parity check matrix.

In some cases, the LDPC subcode associated with the first encoding procedure and the LDPC subcode associated with the second encoding procedure may be the same LDPC subcode. In some cases, the LDPC subcode associated with the first encoding procedure and the LDPC subcode associated with the second encoding procedure may be different LDPC subcodes.

The receiving device may decode the message (e.g., may decode s) either by first decoding u from v, and then decode s from u, or by directly decoding for s using an equivalent parity check matrix. For instance, such a parity check matrix may include two rows and three columns, a first row include a matrix for s (e.g., the sub matrix $H_s$), a matrix for u (e.g., the sub matrix $P_u$), and an entry of 0, the second row including an entry of 0, a matrix for u (e.g., the sub matrix $H_s$), and a matrix for v (e.g., the sub matrix $P_u$).

Figure 4:
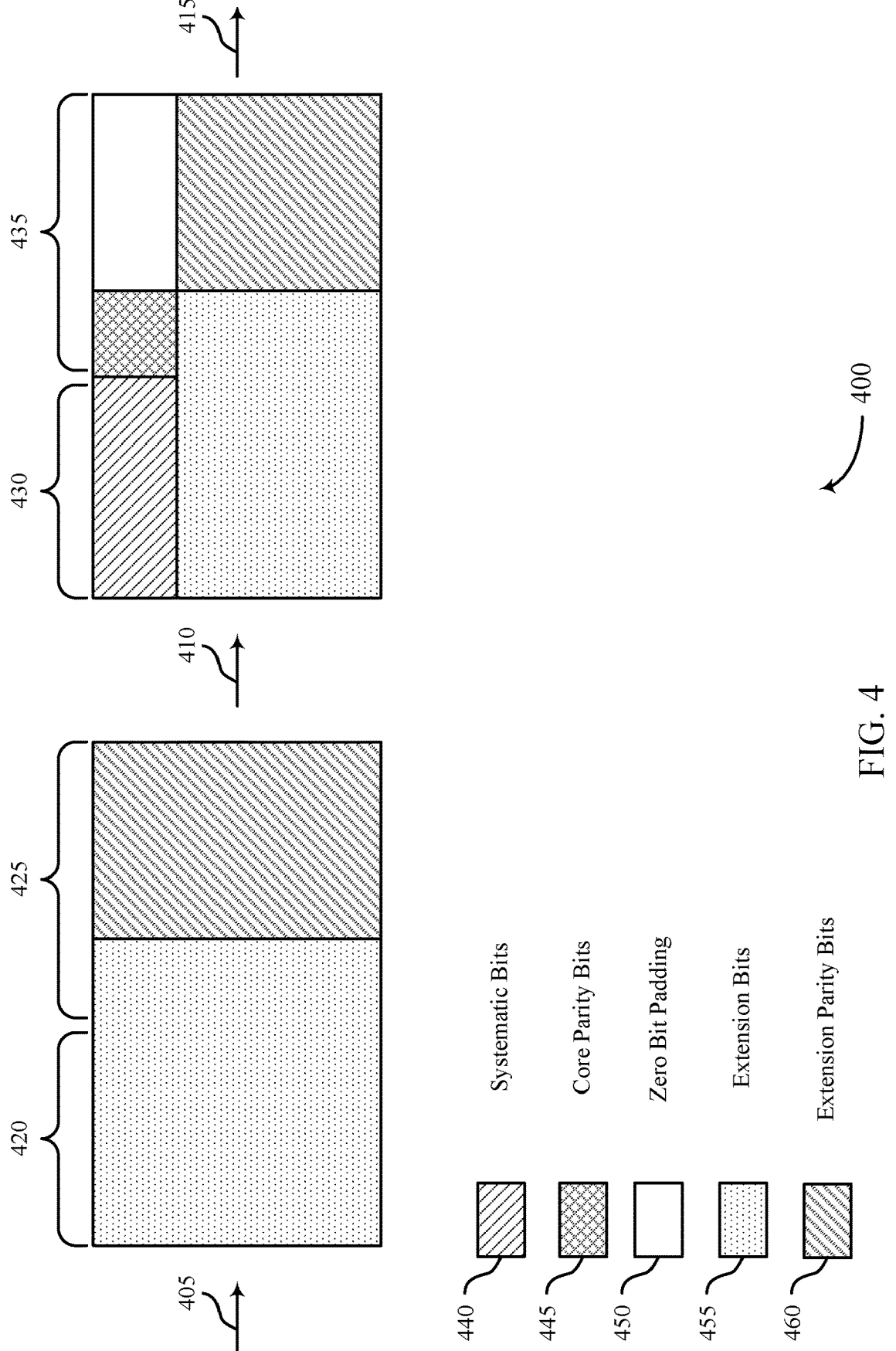
FIG. 4 shows an example of a encoding scheme that supports code designs for nonuniform sources in accordance with one or more aspects of the present disclosure.

FIG. 4 shows an example of a encoding scheme 400 that supports code designs for nonuniform sources in accordance with one or more aspects of the present disclosure. The encoding schemes may be performed by a first device (e.g., the first device 205-*a* as described with reference to FIG. 2). The LDPC code may include systematic bits 440, core parity bits 445, zero bit padding 450, extension bits 455, and extension parity bits 460. In some cases, a first set of columns 420 may correspond to a sub matrix $H_S$, and a second set of columns 425 may correspond to a sub matrix $P_u$. In some cases, a third set of columns 430 may correspond to the sub matrix $H_u$, and a fourth set of columns 435 may correspond to a sub matrix $P_v$.

In some cases, a first device may encode a message in accordance with a first encoding procedure associated with an LDGM associated with an LDPC code and a second encoding procedure associated with the same LDPC code. The first device may encode a message 405 (e.g., which may be referred to as an input s) into a first encoded message 410 (e.g., which may be referred to as an output u) based on the respective portion of the LDGM. The message 405 may correspond to the first set of columns 420 and the first encoded message 410 may correspond to the second set of columns 425 (e.g., $P_u*u=H_s*S$). In some cases, the LDGM may start after the special extension row as described with reference to FIG. 2. The first device may encode the first encoded message 410 into a second encoded message 415 (e.g., which may be referred to as an output v, such that the transmitting devices sends a transmission defined as Transmit (u, v)) based on the respective portion of the LDPC code. The first encoded message 410 may correspond to the third set of columns 430 and the second encoded message 415 may correspond to the fourth set of columns 435 (e.g., $P_v*v=H_u*u$). The first device may transmit the first encoded message 410 and the second encoded message 415 to a second device. In some cases, the second device may first decode the first encoded message 410 and then decode the message 405. In some cases, the second device may directly decode the message 405 using an equivalent parity check matrix.

That is, the receiving device may decode the message (e.g., may decode s) either by first decoding u from v, and then decode s from u, or by directly decoding for s using an equivalent parity check matrix. For instance, such a parity check matrix may include two rows and three columns, a first row include a matrix for s (e.g., the sub matrix $H_s$), a matrix for u (e.g., the sub matrix $P_u$), and an entry of 0, the second row including an entry of 0, a matrix for u (e.g., the sub matrix $H_u$), and a matrix for v (e.g., the sub matrix $P_v$).

Figure 5:
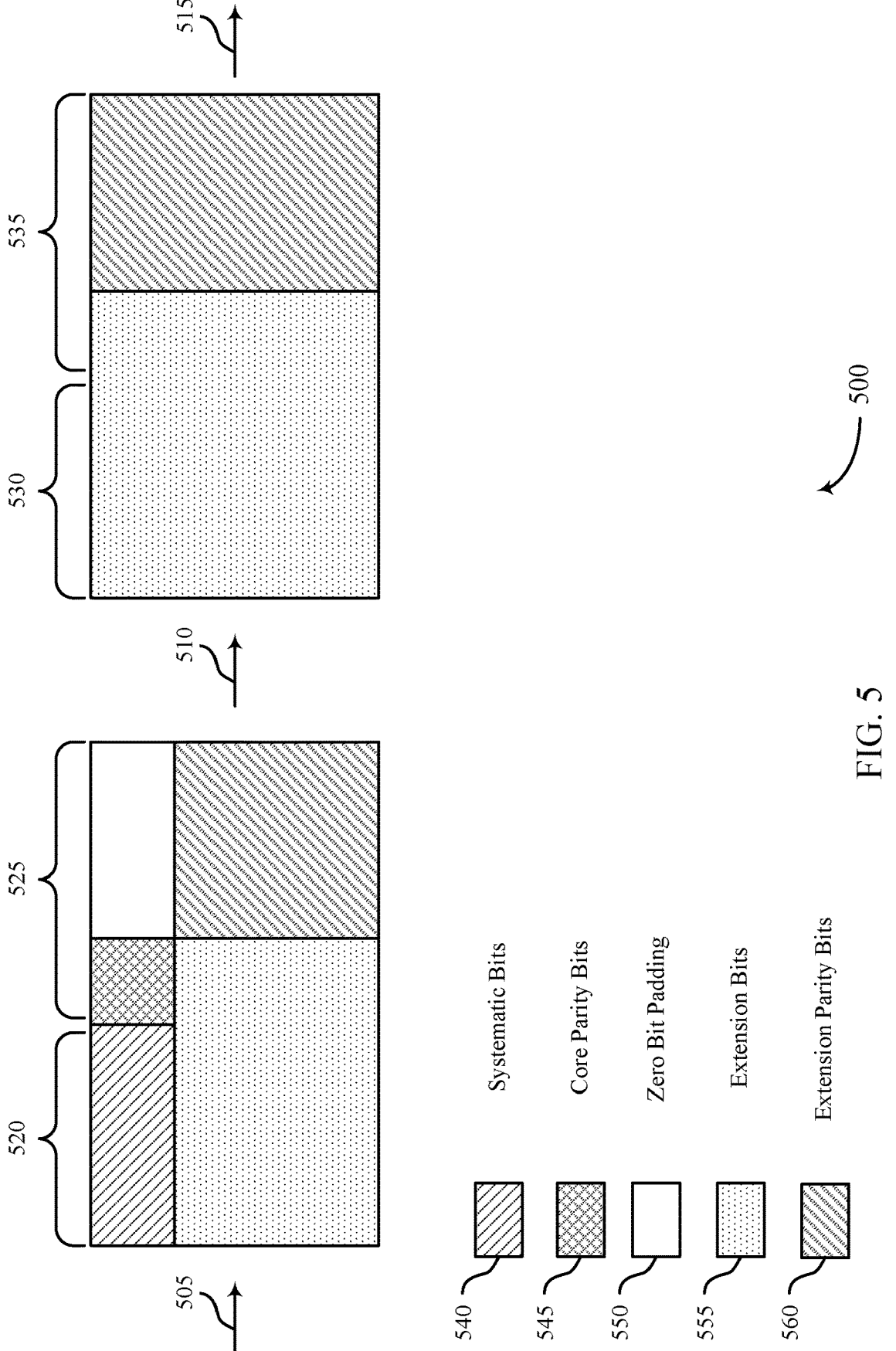
FIG. 5 shows an example of a encoding scheme that supports code designs for nonuniform sources in accordance with one or more aspects of the present disclosure.

FIG. 5 shows an example of a encoding scheme 500 that supports code designs for nonuniform sources in accordance with one or more aspects of the present disclosure. The encoding schemes may be performed by a first device (e.g., the first device 205-*a* as described with reference to FIG. 2). The LDPC code may include systematic bits 540, core parity bits 545, zero bit padding 550, extension bits 555, and extension parity bits 560. In some cases, a first set of columns 520 may correspond to a sub matrix $H_S$, and a second set of columns 525 may correspond to a sub matrix $P_u$. In some cases, a third set of columns 530 may correspond to the sub matrix $H_u$, and a fourth set of columns 535 may correspond to a sub matrix $P_v$.

In some cases, a first device may encode a message in accordance with a first encoding procedure associated with an LDPC code and a second encoding procedure associated with an LDGM matrix associated with the same LDPC code. The first device may encode a message 505 (e.g., which may be referred to as an input s) into a first encoded message 510 (e.g., which may be referred to as an output u) based on the respective portion of the LDPC code. The message 505 may correspond to the first set of columns 520 and the first encoded message 510 may correspond to the second set of columns 525 (e.g., $P_u$\*u=$H_s$\*S). The first device may encode the first encoded message 510 into a second encoded message 515 (e.g., which may be referred to as an output v, such that the transmitting devices sends a transmission defined as Transmit(u, v)) based on the respective portion of the LDGM matrix. The first encoded message 510 may correspond to the third set of columns 530 and the second encoded message 515 may correspond to the fourth set of columns 535 (e.g., $P_v$\*v=$H_u$\*u). In some cases, the LDGM matrix may start after the special extension row as described with reference to FIG. 2. The first device may transmit the first encoded message 410 and the second encoded message 515 to a second device (e.g., may send Transmit(u, v)). In some cases, the second device may first decode the first encoded message 510 and then decode the message 505. In some cases, the second device may directly decode the message 505 using an equivalent parity check matrix.

That is, the receiving device may decode the message (e.g., may decode s) either by first decoding u from v, and then decode s from u, or by directly decoding for s using an equivalent parity check matrix. For instance, such a parity check matrix may include two rows and three columns, a first row include a matrix for s (e.g., the sub matrix $H_s$), a matrix for u (e.g., the sub matrix $P_u$), and an entry of 0, the second row including an entry of 0, a matrix for u (e.g., the sub matrix $H_u$), and a matrix for v (e.g., the sub matrix $P_v$).

Figure 6:
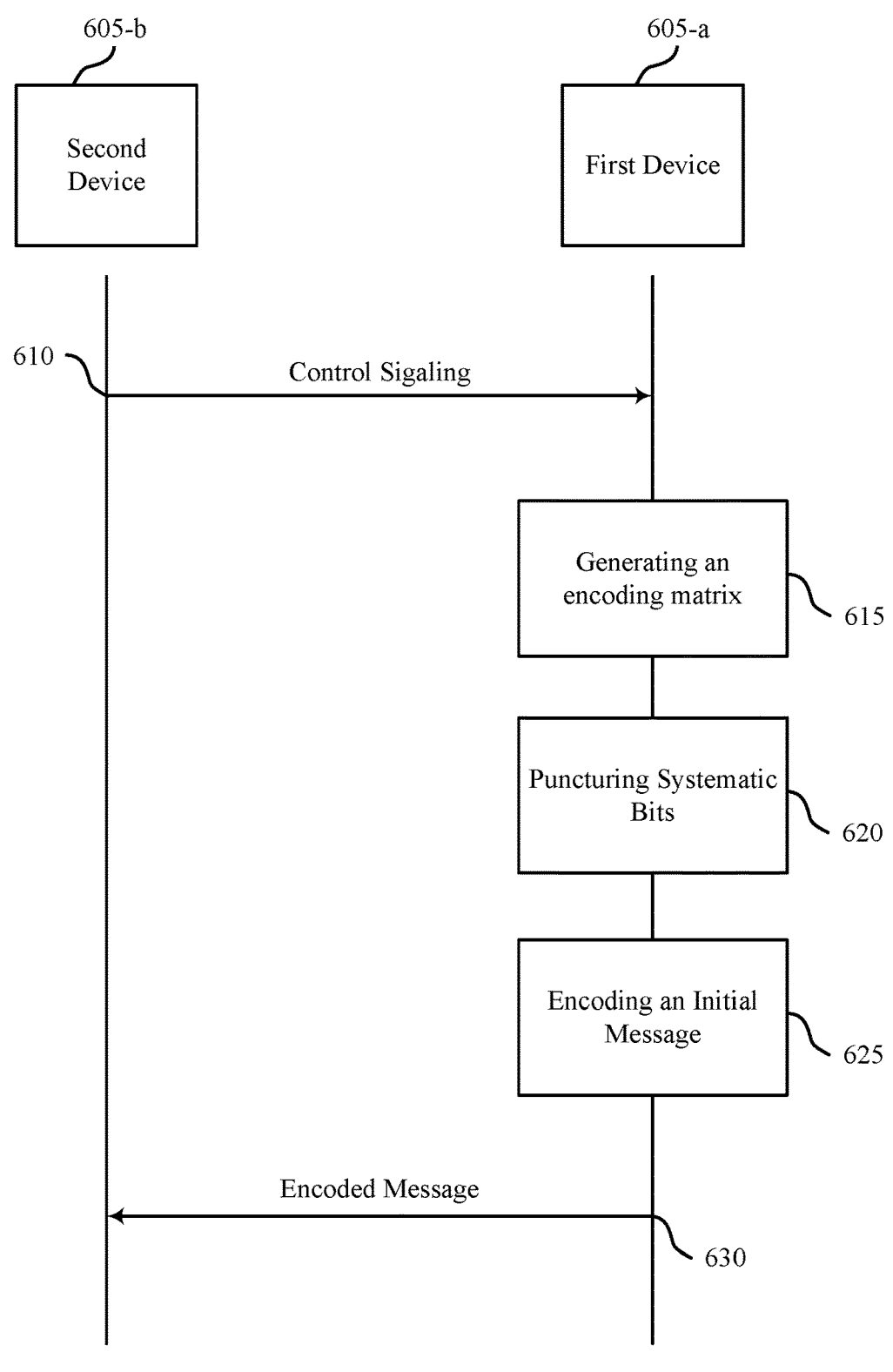
FIG. 6 shows an example of a process flow that supports code designs for nonuniform sources in accordance with one or more aspects of the present disclosure.

FIG. 6 shows an example of a process flow 600 that supports code designs for nonuniform sources in accordance with one or more aspects of the present disclosure. In some examples, process flow 600 may implement aspects of, or be implemented by aspects of, the wireless communication system 100, the wireless communication system 200, encoding scheme 300, encoding scheme 400, or encoding scheme 500. For example, the process flow 600 may include a first device 605-*a* and a second device 605-*b* which may be examples of corresponding devices described with reference to FIGS. 1 and 5.

At 610, the second device 605-*b* may transmit control signaling. The control signaling may include a grant of resources for transmissions (e.g., at 630). In some examples, the control signaling indicates a sequence of RVs of an initial transmission according to a circular buffer corresponding to an encoding matrix. In some cases, an initial RV of the sequence of RVs may not include a set of information columns (e.g., may be RV2, or a new or special RV that does not include any information columns or systematic bits). In some cases, a second RV of the sequence of RVs may include the set of information columns. The second RV may occur in the sequence of RVs after a first set of core parity columns and one or more sets of extension parity columns have been transmitted via a first RV and one or more additional RVs according to the circular buffer (e.g., an RV that includes systematic bits, such as RV0, may be included later, or at the end, of the sequence of RVs). In some cases, no RVs in the sequence of RVs may include the set of information columns (e.g., the sequence of RVs does not include any RV that includes systematic bits, such as RV0). In some cases, the control signaling may include an indication of an offset value, an indication of an index of the initial column of the encoding matrix with reference to the circular buffer, an indication of a final index of the first RV with reference to the circular buffer, or any combination thereof.

At 615, the first device 605-*a* may generate an encoding matrix including the set of information columns including systematic bits, a first set of core parity columns including the first set of parity bits, and the one or more sets of extension parity columns including the second set of parity bits. In some cases, the initial column of the encoding matrix may be associated with the first set of parity bits or the second set of parity bits.

At 620, the first device 605-*a* may puncture one or more of the systematic bits with the first set of parity bits, the second set of parity bits, or a combination thereof. The puncturing may be based on the offset value indicating an initial column of the encoding matrix. In some cases, the offset value indicating the initial column of the encoding matrix may be based on an entropy of the initial message exceeding an entropy threshold. The initial column may include one of the information columns of the set of information columns, or a core parity column of the first set of core parity columns, or an extension parity column of the one or more sets of extension parity columns based at least in part on the entropy of the initial message.

At 625, the first device 605-*a* may encode an initial message in accordance with the encoding matrix based on the offset indicating the initial column of the encoding matrix. In some cases, the first device 605-*a* may select, a subset of parity bits of the first set of parity bits, the second set of parity bits, or both.

In some cases, the encoding may be based on the subset of parity bits. The first device 605-*a* may select the subset of parity bits based on a degree of one or more check nodes associated with the subset of parity bits, an order of the set of information columns including the systematic bits, an order of the first set of core parity columns including the first set of parity bits, an order of the one or more sets of extension parity columns, or a candidate linear combination of the subset of parity bits, or any combination thereof.

At 630, the first device 605-*a* may transmit the encoded initial message. The encoded initial message may include a RV of the encoding matrix corresponding to the first set of parity bits or the second set of parity bits according to the offset value. The encoded initial message may not include the systematic bits.

In some cases, the first device 605-*a* may initiate transmission of the RV of the encoding matrix according to the puncturing and encoding, an initial bit of the RV including a first column of first set of core parity columns. In some cases, the first device 605-*a* may initiate transmission of the RV of the encoding matrix according to the puncturing and encoding, an initial bit of the RV including a first occurring degree one extension parity bit of the first set of parity bits or the second set of parity bits. The first occurring degree one extension parity bit may include a special extension parity bit connecting the initial bit of the RV to the punctured systematic bits. In some cases, the first device 605-*a* may initiate transmission of the RV of the encoding matrix according to the puncturing and encoding, an initial bit of the RV including a second occurring degree one extension parity bit of the first set of parity bits or the second set of parity bits. In some cases, a first RV of a set of RVs of the encoding matrix may correspond to the set of information columns. The RV of the encoding matrix may include a second RV of the set of RVs that does not include the set of information columns.

Figure 7:
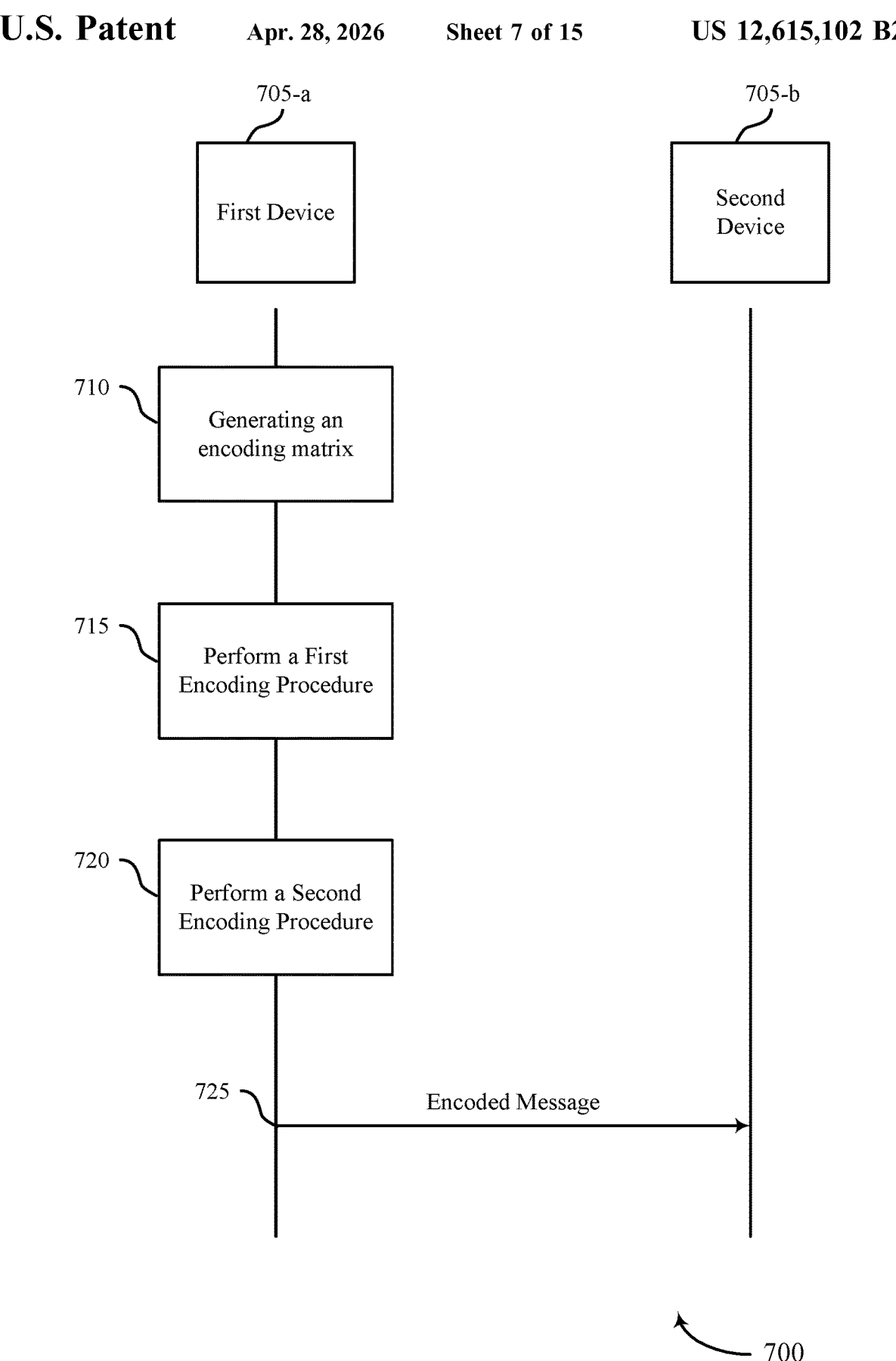
FIG. 7 shows an example of a process flow that supports code designs for nonuniform sources in accordance with one or more aspects of the present disclosure.

FIG. 7 shows an example of a process flow 700 that supports code designs for nonuniform sources in accordance with one or more aspects of the present disclosure. In some examples, process flow 700 may implement aspects of, or be implemented by aspects of, the wireless communication system 100, the wireless communication system 200, encoding scheme 300, encoding scheme 400, encoding scheme 500, or process flow 600. For example, the process flow 700 may include a first device 705-*a* and a second device 705-*b* which may be examples of corresponding devices described with reference to FIGS. 1 and 6.

At 710, the first device 705-*a* may generate an encoding matrix including a set of information columns including systematic bits, a first set of core parity columns including a first set of parity bits, and one or more sets of extension parity columns including a second set of parity bits.

At 715, the first device 705-*a* may perform a first encoding procedure according to a first portion of the encoding matrix.

At 720, the first device 705-*a* may performing a second encoding procedure on an output of the first encoding procedure according to a second portion of the encoding matrix.

At 725, the first device 705-*a* may transmit an encoded message based on an output of the first encoding procedure and an output of the second encoding procedure.

In some cases, the first encoding procedure may include a LDPC corresponding to the first systematic bits and the first set of parity bits and the second encoding procedure may include a LDPC corresponding to the first systematic bits and the first set of parity bits as described with reference to FIG. 3. In some cases, the first encoding procedure may include a LDGM corresponding to the second set of parity bits and the second encoding procedure may include a LDPC corresponding to the first systematic bits and the first set of parity bits, as described with reference to FIG. 4. In some cases, the first encoding procedure may include a LDPC corresponding to the first systematic bits and the first set of parity bits and the second encoding procedure may include a LDGM corresponding to the second set of parity bits.

Figure 8:
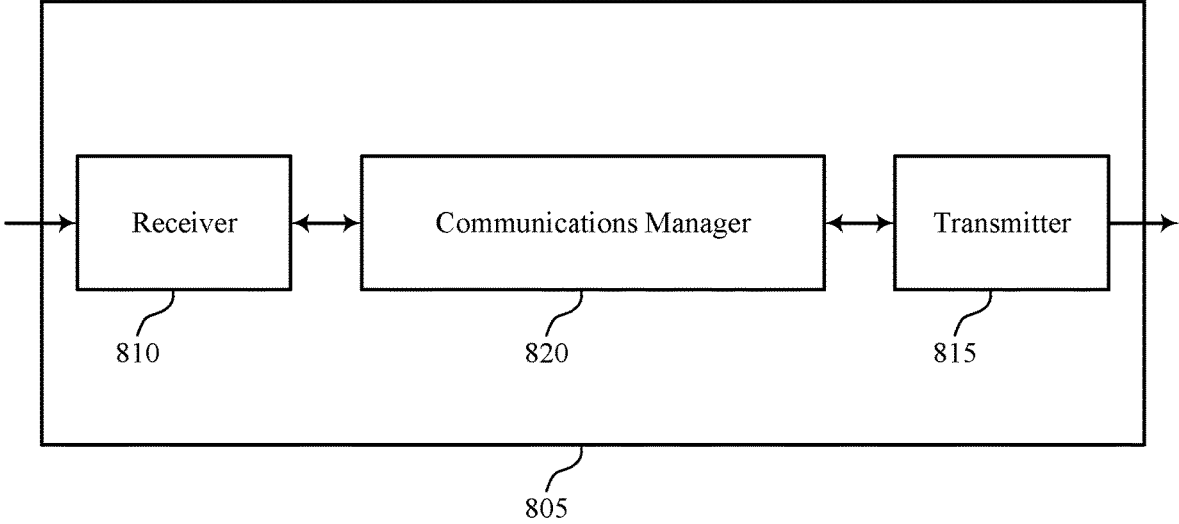
FIGS. 8 and 9 show block diagrams of devices that support code designs for nonuniform sources in accordance with one or more aspects of the present disclosure.

FIG. 8 shows a block diagram 800 of a device 805 that supports code designs for nonuniform sources in accordance with one or more aspects of the present disclosure. The device 805 (e.g., a UE 115 or a network entity 105 as described with reference to FIG. 1) may be an example of aspects of a device as described herein. The device 805 may include a receiver 810, a transmitter 815, and a communications manager 820. The device 805, or one or more components of the device 805 (e.g., the receiver 810, the transmitter 815, the communications manager 820), may include at least one processor, which may be coupled with at least one memory, to, individually or collectively, support or enable the described techniques. Each of these components may be in communication with one another (e.g., via one or more buses).

The receiver 810 may provide a means for receiving information such as packets, user data, control information, or any combination thereof associated with various information channels (e.g., control channels, data channels, information channels related to code designs for nonuniform sources). Information may be passed on to other components of the device 805. The receiver 810 may utilize a single antenna or a set of multiple antennas.

The transmitter 815 may provide a means for transmitting signals generated by other components of the device 805. For example, the transmitter 815 may transmit information such as packets, user data, control information, or any combination thereof associated with various information channels (e.g., control channels, data channels, information channels related to code designs for nonuniform sources). In some examples, the transmitter 815 may be co-located with a receiver 810 in a transceiver module. The transmitter 815 may utilize a single antenna or a set of multiple antennas.

The communications manager 820, the receiver 810, the transmitter 815, or various combinations or components thereof may be examples of means for performing various aspects of code designs for nonuniform sources as described herein. For example, the communications manager 820, the receiver 810, the transmitter 815, or various combinations or components thereof may be capable of performing one or more of the functions described herein.

In some examples, the communications manager 820, the receiver 810, the transmitter 815, or various combinations or components thereof may be implemented in hardware (e.g., in communications management circuitry). The hardware may include at least one of a processor, a DSP, a CPU, an ASIC, an FPGA or other programmable logic device, a microcontroller, discrete gate or transistor logic, discrete hardware components, or any combination thereof configured as or otherwise supporting, individually or collectively, a means for performing the functions described in the present disclosure. In some examples, at least one processor and at least one memory coupled with the at least one processor may be configured to perform one or more of the functions described herein (e.g., by one or more processors, individually or collectively, executing instructions stored in the at least one memory).

Additionally, or alternatively, the communications manager 820, the receiver 810, the transmitter 815, or various combinations or components thereof may be implemented in code (e.g., as communications management software or firmware) executed by at least one processor (e.g., referred to as a processor-executable code). If implemented in code executed by at least one processor, the functions of the communications manager 820, the receiver 810, the transmitter 815, or various combinations or components thereof may be performed by a general-purpose processor, a DSP, a CPU, an ASIC, an FPGA, a microcontroller, or any combination of these or other programmable logic devices (e.g., configured as or otherwise supporting, individually or collectively, a means for performing the functions described in the present disclosure).

In some examples, the communications manager 820 may be configured to perform various operations (e.g., receiving, obtaining, monitoring, outputting, transmitting) using or otherwise in cooperation with the receiver 810, the transmitter 815, or both. For example, the communications manager 820 may receive information from the receiver 810, send information to the transmitter 815, or be integrated in combination with the receiver 810, the transmitter 815, or both to obtain information, output information, or perform various other operations as described herein.

The communications manager 820 may support wireless communications in accordance with examples as disclosed herein. For example, the communications manager 820 is capable of, configured to, or operable to support a means for generating an encoding matrix including a set of information columns including systematic bits, a first set of core parity columns including a first set of parity bits, and one or more sets of extension parity columns including a second set of parity bits. The communications manager 820 is capable of, configured to, or operable to support a means for puncturing one or more of the systematic bits with the first set of parity bits, the second set of parity bits, or a combination thereof, based on an offset value indicating an initial column of the encoding matrix. The communications manager 820 is capable of, configured to, or operable to support a means for encoding an initial message in accordance with the encoding matrix based on the offset indicating the initial column of the encoding matrix.

Additionally, or alternatively, the communications manager 820 may support wireless communications in accordance with examples as disclosed herein. For example, the communications manager 820 is capable of, configured to, or operable to support a means for generating an encoding matrix including a set of information columns including systematic bits, a first set of core parity columns including a first set of parity bits, and one or more sets of extension parity columns including a second set of parity bits. The communications manager 820 is capable of, configured to, or operable to support a means for performing a first encoding procedure according to a first portion of the encoding matrix. The communications manager 820 is capable of, configured to, or operable to support a means for performing a second encoding procedure on an output of the first encoding procedure according to a second portion of the encoding matrix. The communications manager 820 is capable of, configured to, or operable to support a means for transmitting an encoded message based on an output of the first encoding procedure and an output of the second encoding procedure.

By including or configuring the communications manager 820 in accordance with examples as described herein, the device 805 (e.g., at least one processor controlling or otherwise coupled with the receiver 810, the transmitter 815, the communications manager 820, or a combination thereof) may support techniques for more efficient utilization of communication resources, more reliable wireless communications, improved system throughput, and the like.

Figure 9:
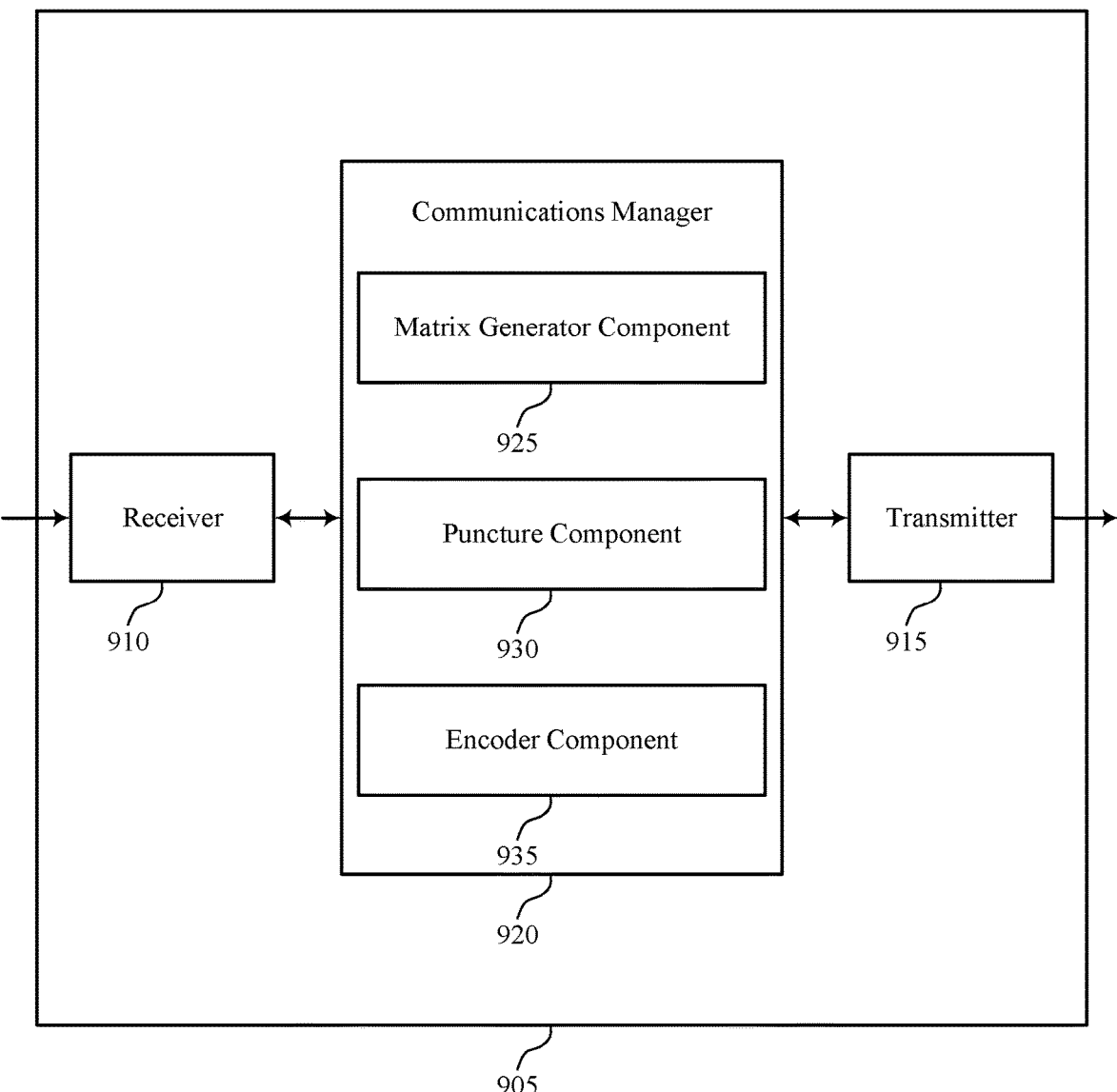

FIG. 9 shows a block diagram 900 of a device 905 that supports code designs for nonuniform sources in accordance with one or more aspects of the present disclosure. The device 905 (e.g., a UE 115 or a network entity 105 as described with reference to FIG. 1) may be an example of aspects of a device 805 or a device (e.g., a UE 115 or a network entity 105) as described herein. The device 905 may include a receiver 910, a transmitter 915, and a communications manager 920. The device 905, or one or more components of the device 905 (e.g., the receiver 910, the transmitter 915, the communications manager 920), may include at least one processor, which may be coupled with at least one memory, to support the described techniques. Each of these components may be in communication with one another (e.g., via one or more buses).

The receiver 910 may provide a means for receiving information such as packets, user data, control information, or any combination thereof associated with various information channels (e.g., control channels, data channels, information channels related to code designs for nonuniform sources). Information may be passed on to other components of the device 905. The receiver 910 may utilize a single antenna or a set of multiple antennas.

The transmitter 915 may provide a means for transmitting signals generated by other components of the device 905. For example, the transmitter 915 may transmit information such as packets, user data, control information, or any combination thereof associated with various information channels (e.g., control channels, data channels, information channels related to code designs for nonuniform sources). In some examples, the transmitter 915 may be co-located with a receiver 910 in a transceiver module. The transmitter 915 may utilize a single antenna or a set of multiple antennas.

The device 905, or various components thereof, may be an example of means for performing various aspects of code designs for nonuniform sources as described herein. For example, the communications manager 920 may include a matrix generator component 925, a puncture component 930, an encoder component 935, or any combination thereof. The communications manager 920 may be an example of aspects of a communications manager 820 as described herein. In some examples, the communications manager 920, or various components thereof, may be configured to perform various operations (e.g., receiving, obtaining, monitoring, outputting, transmitting) using or otherwise in cooperation with the receiver 910, the transmitter 915, or both. For example, the communications manager 920 may receive information from the receiver 910, send information to the transmitter 915, or be integrated in combination with the receiver 910, the transmitter 915, or both to obtain information, output information, or perform various other operations as described herein.

The communications manager 920 may support wireless communications in accordance with examples as disclosed herein. The matrix generator component 925 is capable of, configured to, or operable to support a means for generating an encoding matrix including a set of information columns including systematic bits, a first set of core parity columns including a first set of parity bits, and one or more sets of extension parity columns including a second set of parity bits. The puncture component 930 is capable of, configured to, or operable to support a means for puncturing one or more of the systematic bits with the first set of parity bits, the second set of parity bits, or a combination thereof, based on an offset value indicating an initial column of the encoding matrix. The encoder component 935 is capable of, configured to, or operable to support a means for encoding an initial message in accordance with the encoding matrix based on the offset indicating the initial column of the encoding matrix.

Additionally, or alternatively, the communications manager 920 may support wireless communications in accordance with examples as disclosed herein. The matrix generator component 925 is capable of, configured to, or operable to support a means for generating an encoding matrix including a set of information columns including systematic bits, a first set of core parity columns including a first set of parity bits, and one or more sets of extension parity columns including a second set of parity bits. The encoder component 935 is capable of, configured to, or operable to support a means for performing a first encoding procedure according to a first portion of the encoding matrix. The encoder component 935 is capable of, configured to, or operable to support a means for performing a second encoding procedure on an output of the first encoding procedure according to a second portion of the encoding matrix. The encoder component 935 is capable of, configured to, or operable to support a means for transmitting an encoded message based on an output of the first encoding procedure and an output of the second encoding procedure.

Figure 10:
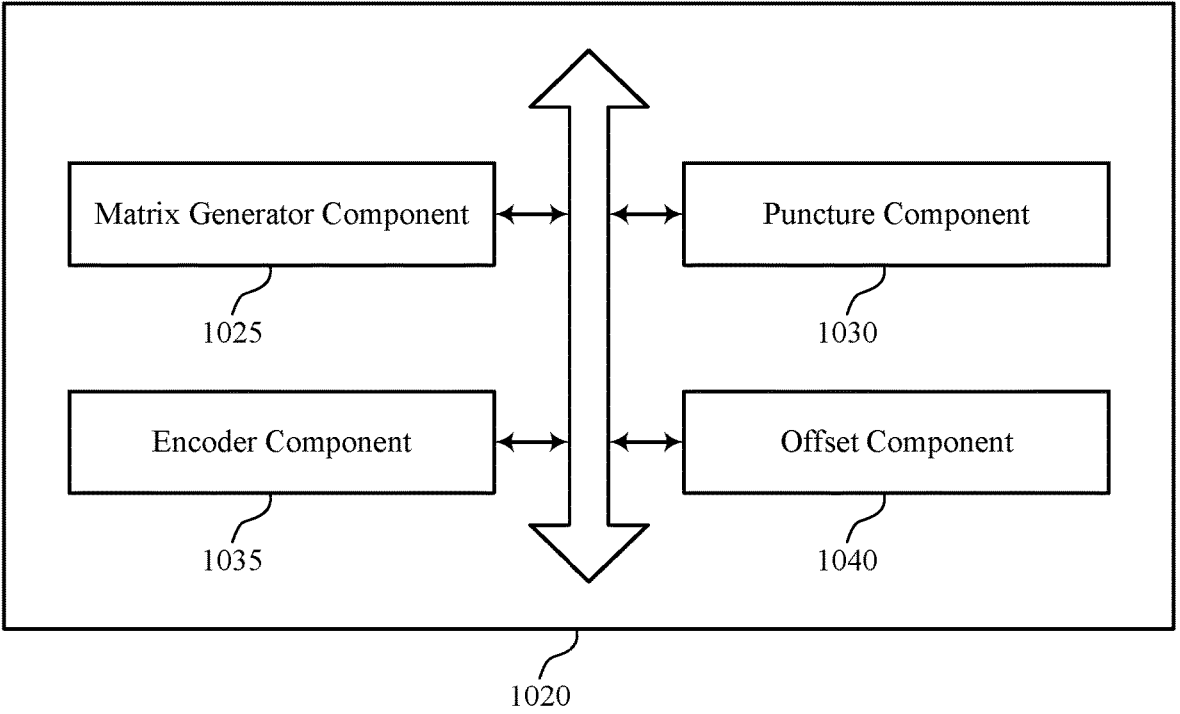
FIG. 10 shows a block diagram of a communications manager that supports code designs for nonuniform sources in accordance with one or more aspects of the present disclosure.
Figure 10:
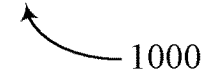

FIG. 10 shows a block diagram 1000 of a communications manager 1020 that supports code designs for nonuniform sources in accordance with one or more aspects of the present disclosure. The communications manager 1020 may be an example of aspects of a communications manager 820, a communications manager 920, or both, as described herein. The communications manager 1020, or various components thereof, may be an example of means for performing various aspects of code designs for nonuniform sources as described herein. For example, the communications manager 1020 may include a matrix generator component 1025, a puncture component 1030, an encoder component 1035, an offset component 1040, or any combination thereof. Each of these components, or components or subcomponents thereof (e.g., one or more processors, one or more memories), may communicate, directly or indirectly, with one another (e.g., via one or more buses).

The communications manager 1020 may support wireless communications in accordance with examples as disclosed herein. The matrix generator component 1025 is capable of, configured to, or operable to support a means for generating an encoding matrix including a set of information columns including systematic bits, a first set of core parity columns including a first set of parity bits, and one or more sets of extension parity columns including a second set of parity bits. The puncture component 1030 is capable of, configured to, or operable to support a means for puncturing one or more of the systematic bits with the first set of parity bits, the second set of parity bits, or a combination thereof, based on an offset value indicating an initial column of the encoding matrix. The encoder component 1035 is capable of, configured to, or operable to support a means for encoding an initial message in accordance with the encoding matrix based on the offset indicating the initial column of the encoding matrix.

In some examples, the encoder component 1035 is capable of, configured to, or operable to support a means for transmitting the encoded initial message, the encoded initial message including a RV of the encoding matrix corresponding to the first set of parity bits or the second set of parity bits according to the offset value, where the encoded initial message does not include the systematic bits.

In some examples, the offset component 1040 is capable of, configured to, or operable to support a means for initiating transmission of the RV of the encoding matrix according to the puncturing and encoding, an initial bit of the RV corresponding to a first column of first set of core parity columns.

In some examples, the offset component 1040 is capable of, configured to, or operable to support a means for initiating transmission of the RV of the encoding matrix according to the puncturing and encoding, an initial bit of the RV including a first occurring degree one extension parity bit of the first set of parity bits or the second set of parity bits.

In some examples, the first occurring degree one extension parity bit includes a special extension parity bit connecting the initial bit of the RV to the punctured systematic bits.

In some examples, the offset component 1040 is capable of, configured to, or operable to support a means for initiating transmission of the RV of the encoding matrix according to the puncturing and encoding, an initial bit of the RV including a second occurring degree one extension parity bit of the first set of parity bits or the second set of parity bits.

In some examples, a first RV of a set of RVs of the encoding matrix corresponds to the set of information columns. In some examples, the RV of the encoding matrix includes a second RV of the set of RVs that does not include the set of information columns.

In some examples, the offset value indicating the initial column of the encoding matrix is based on an entropy of the initial message exceeding an entropy threshold. The initial column may include one of the information columns of the set of information columns, or a core parity column of the first set of core parity columns, or an extension parity column of the one or more sets of extension parity columns based at least in part on the entropy of the initial message.

In some examples, the offset component 1040 is capable of, configured to, or operable to support a means for receiving control signaling indicating a sequence of RVs of an initial transmission according to a circular buffer corresponding to the encoding matrix, where an initial RV of the sequence of RVs does not include the set of information columns.

In some examples, a second RV of the sequence of RVs includes the set of information columns, the second RV occurring in the sequence of RVs after the first set of core parity columns and the one or more sets of extension parity columns have been transmitted via a first RV and one or more additional RVs according to the circular buffer.

In some examples, no RVs in the sequence of RVs includes the set of information columns.

In some examples, the control signaling includes an indication of the offset value, an indication of an index of the initial column of the encoding matrix with reference to the circular buffer, an indication of a final index of the first RV with reference to the circular buffer, or any combination thereof.

In some examples, the puncture component 1030 is capable of, configured to, or operable to support a means for selecting, a subset of parity bits of the first set of parity bits, the second set of parity bits, or both, where the encoding is based on the subset of parity bits.

In some examples, the selecting is based on a degree of one or more check nodes associated with the subset of parity bits, an order of the set of information columns including the systematic bits, an order of the first set of core parity columns including the first set of parity bits, an order of the one or more sets of extension parity columns, or a candidate linear combination of the subset of parity bits, or any combination thereof.

In some examples, the initial column of the encoding matrix is associated with the first set of parity bits or the second set of parity bits.

Additionally, or alternatively, the communications manager 1020 may support wireless communications in accordance with examples as disclosed herein. In some examples, the matrix generator component 1025 is capable of, configured to, or operable to support a means for generating an encoding matrix including a set of information columns including systematic bits, a first set of core parity columns including a first set of parity bits, and one or more sets of extension parity columns including a second set of parity bits. In some examples, the encoder component 1035 is capable of, configured to, or operable to support a means for performing a first encoding procedure according to a first portion of the encoding matrix. In some examples, the encoder component 1035 is capable of, configured to, or operable to support a means for performing a second encoding procedure on an output of the first encoding procedure according to a second portion of the encoding matrix. In some examples, the encoder component 1035 is capable of, configured to, or operable to support a means for transmitting an encoded message based on an output of the first encoding procedure and an output of the second encoding procedure.

In some examples, the first encoding procedure includes a LDPC corresponding to the first systematic bits and the first set of parity bits and the second encoding procedure includes a LDPC corresponding to the first systematic bits and the first set of parity bits.

In some examples, the first encoding procedure includes a LDGM corresponding to the second set of parity bits and the second encoding procedure includes a LDPC corresponding to the first systematic bits and the first set of parity bits.

In some examples, the first encoding procedure includes a LDPC corresponding to the first systematic bits and the first set of parity bits and the second encoding procedure includes a LDGM corresponding to the second set of parity bits.

Figure 11:
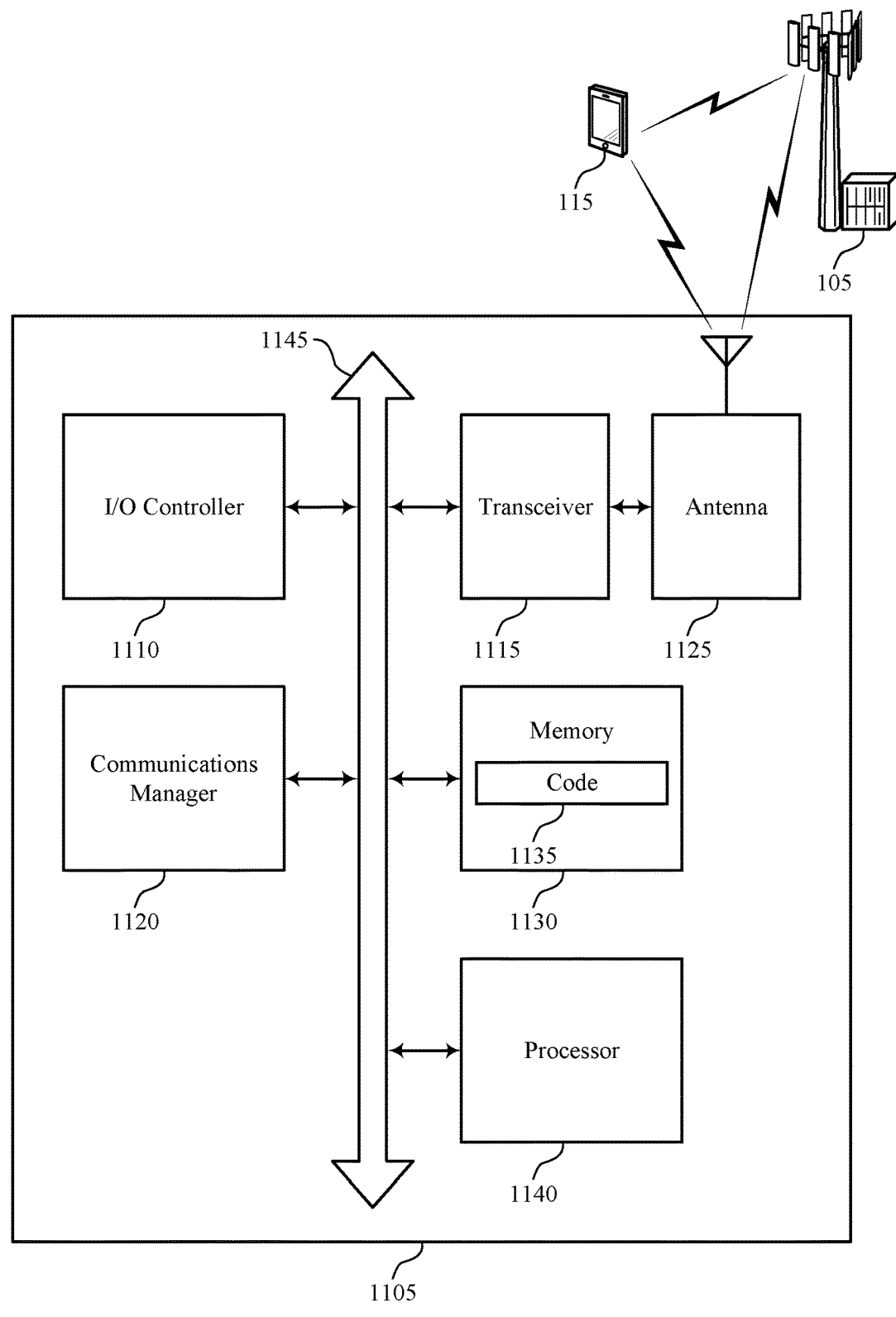
FIG. 11 shows a diagram of a system including a device that supports code designs for nonuniform sources in accordance with one or more aspects of the present disclosure.

FIG. 11 shows a diagram of a system 1100 including a device 1105 that supports code designs for nonuniform sources in accordance with one or more aspects of the present disclosure. The device 1105 (e.g., a UE 115 or a network entity 105 as described with reference to FIG. 1) may be an example of or include components of a device 805, a device 905, or a device as described herein. The device 1105 may include components for bi-directional voice and data communications including components for transmitting and receiving communications, such as a com- munications manager 1120, an I/O controller, such as an I/O controller 1110, a transceiver 1115, one or more antennas 1125, at least one memory 1130, code 1135, and at least one processor 1140. These components may be in electronic communication or otherwise coupled (e.g., operatively, communicatively, functionally, electronically, electrically) via one or more buses (e.g., a bus 1145).

The I/O controller 1110 may manage input and output signals for the device 1105. The I/O controller 1110 may also manage peripherals not integrated into the device 1105. In some cases, the I/O controller 1110 may represent a physical connection or port to an external peripheral. In some cases, the I/O controller 1110 may utilize an operating system such as iOS®, ANDROID®, MS-DOS®, MS-WINDOWS®, OS/2®, UNIX®, LINUX®, or another known operating system. Additionally, or alternatively, the I/O controller 1110 may represent or interact with a modem, a keyboard, a mouse, a touchscreen, or a similar device. In some cases, the I/O controller 1110 may be implemented as part of one or more processors, such as the at least one processor 1140. In some cases, a user may interact with the device 1105 via the I/O controller 1110 or via hardware components controlled by the I/O controller 1110.

In some cases, the device 1105 may include a single antenna. However, in some other cases, the device 1105 may have more than one antenna, which may be capable of concurrently transmitting or receiving multiple wireless transmissions. The transceiver 1115 may communicate bi- directionally via the one or more antennas 1125 using wired or wireless links as described herein. For example, the transceiver 1115 may represent a wireless transceiver and may communicate bi-directionally with another wireless transceiver. The transceiver 1115 may also include a modem to modulate the packets, to provide the modulated packets to one or more antennas 1125 for transmission, and to demodu- late packets received from the one or more antennas 1125. The transceiver 1115, or the transceiver 1115 and one or more antennas 1125, may be an example of a transmitter 815, a transmitter 915, a receiver 810, a receiver 910, or any combination thereof or component thereof, as described herein.

The at least one memory 1130 may include RAM and ROM. The at least one memory 1130 may store computer- readable, computer-executable, or processor-executable code, such as the code 1135. The code 1135 may include instructions that, when executed by the at least one processor 1140, cause the device 1105 to perform various functions described herein. The code 1135 may be stored in a non- transitory computer-readable medium such as system memory or another type of memory. In some cases, the code 1135 may not be directly executable by the at least one processor 1140 but may cause a computer (e.g., when compiled and executed) to perform functions described herein. In some cases, the at least one memory 1130 may include, among other things, a BIOS which may control basic hardware or software operation such as the interaction with peripheral components or devices.

The at least one processor 1140 may include one or more intelligent hardware devices (e.g., one or more general- purpose processors, one or more DSPs, one or more central processing units (CPUs), one or more graphics processing units (GPUs), one or more neural processing units (NPUs) (also referred to as neural network processors or deep learning processors (DLPs)), one or more microcontrollers, one or more ASICs, one or more FPGAs, one or more programmable logic devices, discrete gate or transistor logic, one or more discrete hardware components, or any combination thereof). In some cases, the at least one pro- cessor 1140 may be configured to operate a memory array using a memory controller. In some other cases, a memory controller may be integrated into the at least one processor 1140. The at least one processor 1140 may be configured to execute computer-readable instructions stored in a memory (e.g., the at least one memory 1130) to cause the device 1105 to perform various functions (e.g., functions or tasks sup- porting code designs for nonuniform sources). For example, the device 1105 or a component of the device 1105 may include at least one processor 1140 and at least one memory 1130 coupled with or to the at least one processor 1140, the at least one processor 1140 and the at least one memory 1130 configured to perform various functions described herein. In some examples, the at least one processor 1140 may include multiple processors and the at least one memory 1130 may include multiple memories. One or more of the multiple processors may be coupled with one or more of the multiple memories, which may, individually or collectively, be con- figured to perform various functions described herein. In some examples, the at least one processor 1140 may be a component of a processing system, which may refer to a system (such as a series) of machines, circuitry (including, for example, one or both of processor circuitry (which may include the at least one processor 1140) and memory cir- cuitry (which may include the at least one memory 1130)), or components, that receives or obtains inputs and processes the inputs to produce, generate, or obtain a set of outputs. The processing system may be configured to perform one or more of the functions described herein. For example, the at least one processor 1140 or a processing system including the at least one processor 1140 may be configured to, configurable to, or operable to cause the device 1105 to perform one or more of the functions described herein. Further, as described herein, being "configured to," being "configurable to," and being "operable to" may be used interchangeably and may be associated with a capability, when executing code 1135 (e.g., processor-executable code) stored in the at least one memory 1130 or otherwise, to perform one or more of the functions described herein.

The communications manager 1120 may support wireless communications in accordance with examples as disclosed herein. For example, the communications manager 1120 is capable of, configured to, or operable to support a means for generating an encoding matrix including a set of information columns including systematic bits, a first set of core parity columns including a first set of parity bits, and one or more sets of extension parity columns including a second set of parity bits. The communications manager 1120 is capable of, configured to, or operable to support a means for puncturing one or more of the systematic bits with the first set of parity bits, the second set of parity bits, or a combination thereof, based on an offset value indicating an initial column of the encoding matrix. The communications manager 1120 is capable of, configured to, or operable to support a means for encoding an initial message in accordance with the encoding matrix based on the offset indicating the initial column of the encoding matrix.

Additionally, or alternatively, the communications manager 1120 may support wireless communications in accordance with examples as disclosed herein. For example, the communications manager 1120 is capable of, configured to, or operable to support a means for generating an encoding matrix including a set of information columns including systematic bits, a first set of core parity columns including a first set of parity bits, and one or more sets of extension parity columns including a second set of parity bits. The communications manager 1120 is capable of, configured to, or operable to support a means for performing a first encoding procedure according to a first portion of the encoding matrix. The communications manager 1120 is capable of, configured to, or operable to support a means for performing a second encoding procedure on an output of the first encoding procedure according to a second portion of the encoding matrix. The communications manager 1120 is capable of, configured to, or operable to support a means for transmitting an encoded message based on an output of the first encoding procedure and an output of the second encoding procedure.

By including or configuring the communications manager 1120 in accordance with examples as described herein, the device 1105 may support techniques for improved communication reliability, more efficient utilization of communication resources, improved coordination between devices, improved throughput, and the like.

In some examples, the communications manager 1120 may be configured to perform various operations (e.g., receiving, monitoring, transmitting) using or otherwise in cooperation with the transceiver 1115, the one or more antennas 1125, or any combination thereof. Although the communications manager 1120 is illustrated as a separate component, in some examples, one or more functions described with reference to the communications manager 1120 may be supported by or performed by the at least one processor 1140, the at least one memory 1130, the code 1135, or any combination thereof. For example, the code 1135 may include instructions executable by the at least one processor 1140 to cause the device 1105 to perform various aspects of code designs for nonuniform sources as described herein, or the at least one processor 1140 and the at least one memory 1130 may be otherwise configured to, individually or collectively, perform or support such operations.

FIG. 12 shows a flowchart illustrating a method 1200 that supports code designs for nonuniform sources in accordance with one or more aspects of the present disclosure. The operations of the method 1200 may be implemented by a device or its components as described herein. For example, the operations of the method 1200 may be performed by a device as described with reference to FIGS. 1 through 11. In some examples, a device may execute a set of instructions to control the functional elements of the device to perform the described functions. Additionally, or alternatively, the device may perform aspects of the described functions using special-purpose hardware.

At 1205, the method may include generating an encoding matrix including a set of information columns including systematic bits, a first set of core parity columns including a first set of parity bits, and one or more sets of extension parity columns including a second set of parity bits. The operations of 1205 may be performed in accordance with examples as disclosed herein. In some examples, aspects of the operations of 1205 may be performed by a matrix generator component 1025 as described with reference to FIG. 10.

At 1210, the method may include puncturing one or more of the systematic bits with the first set of parity bits, the second set of parity bits, or a combination thereof, based on an offset value indicating an initial column of the encoding matrix. The operations of 1210 may be performed in accordance with examples as disclosed herein. In some examples, aspects of the operations of 1210 may be performed by a puncture component 1030 as described with reference to FIG. 10.

At 1215, the method may include encoding an initial message in accordance with the encoding matrix based on the offset indicating the initial column of the encoding matrix. The operations of 1215 may be performed in accordance with examples as disclosed herein. In some examples, aspects of the operations of 1215 may be performed by an encoder component 1035 as described with reference to FIG. 10.

FIG. 13 shows a flowchart illustrating a method 1300 that supports code designs for nonuniform sources in accordance with one or more aspects of the present disclosure. The operations of the method 1300 may be implemented by a device or its components as described herein. For example, the operations of the method 1300 may be performed by a device as described with reference to FIGS. 1 through 11. In some examples, a device may execute a set of instructions to control the functional elements of the device to perform the described functions. Additionally, or alternatively, the device may perform aspects of the described functions using special-purpose hardware.

At 1305, the method may include generating an encoding matrix including a set of information columns including systematic bits, a first set of core parity columns including a first set of parity bits, and one or more sets of extension parity columns including a second set of parity bits. The operations of 1305 may be performed in accordance with examples as disclosed herein. In some examples, aspects of the operations of 1305 may be performed by a matrix generator component 1025 as described with reference to FIG. 10.

At 1310, the method may include puncturing one or more of the systematic bits with the first set of parity bits, the second set of parity bits, or a combination thereof, based on an offset value indicating an initial column of the encoding matrix. The operations of 1310 may be performed in accordance with examples as disclosed herein. In some examples, aspects of the operations of 1310 may be performed by a puncture component 1030 as described with reference to FIG. 10.

At 1315, the method may include encoding an initial message in accordance with the encoding matrix based on the offset indicating the initial column of the encoding matrix. The operations of 1315 may be performed in accordance with examples as disclosed herein. In some examples, aspects of the operations of 1315 may be performed by an encoder component 1035 as described with reference to FIG. 10.

At 1320, the method may include transmitting the encoded initial message, the encoded initial message including a RV of the encoding matrix corresponding to the first set of parity bits or the second set of parity bits according to the offset value, where the encoded initial message does not include the systematic bits. The operations of 1320 may be performed in accordance with examples as disclosed herein. In some examples, aspects of the operations of 1320 may be performed by an encoder component 1035 as described with reference to FIG. 10.

FIG. 14 shows a flowchart illustrating a method 1400 that supports code designs for nonuniform sources in accordance with one or more aspects of the present disclosure. The operations of the method 1400 may be implemented by a device or its components as described herein. For example, the operations of the method 1400 may be performed by a device as described with reference to FIGS. 1 through 11. In some examples, a device may execute a set of instructions to control the functional elements of the device to perform the described functions. Additionally, or alternatively, the device may perform aspects of the described functions using special-purpose hardware.

At 1405, the method may include receiving control signaling indicating a sequence of RVs of an initial transmission according to a circular buffer corresponding to the encoding matrix, where an initial RV of the sequence of RVs does not include the set of information columns. The operations of 1405 may be performed in accordance with examples as disclosed herein. In some examples, aspects of the operations of 1405 may be performed by an offset component 1040 as described with reference to FIG. 10.

At 1410, the method may include generating an encoding matrix including a set of information columns including systematic bits, a first set of core parity columns including a first set of parity bits, and one or more sets of extension parity columns including a second set of parity bits. The operations of 1410 may be performed in accordance with examples as disclosed herein. In some examples, aspects of the operations of 1410 may be performed by a matrix generator component 1025 as described with reference to FIG. 10.

At 1415, the method may include puncturing one or more of the systematic bits with the first set of parity bits, the second set of parity bits, or a combination thereof, based on an offset value indicating an initial column of the encoding matrix. The operations of 1415 may be performed in accordance with examples as disclosed herein. In some examples, aspects of the operations of 1415 may be performed by a puncture component 1030 as described with reference to FIG. 10.

At 1420, the method may include encoding an initial message in accordance with the encoding matrix based on the offset indicating the initial column of the encoding matrix. The operations of 1420 may be performed in accordance with examples as disclosed herein. In some examples, aspects of the operations of 1420 may be performed by an encoder component 1035 as described with reference to FIG. 10.

FIG. 15 shows a flowchart illustrating a method 1500 that supports code designs for nonuniform sources in accordance with one or more aspects of the present disclosure. The operations of the method 1500 may be implemented by a device or its components as described herein. For example, the operations of the method 1500 may be performed by a device as described with reference to FIGS. 1 through 11. In some examples, a device may execute a set of instructions to control the functional elements of the device to perform the described functions. Additionally, or alternatively, the device may perform aspects of the described functions using special-purpose hardware.

At 1505, the method may include generating an encoding matrix including a set of information columns including systematic bits, a first set of core parity columns including a first set of parity bits, and one or more sets of extension parity columns including a second set of parity bits. The operations of 1505 may be performed in accordance with examples as disclosed herein. In some examples, aspects of the operations of 1505 may be performed by a matrix generator component 1025 as described with reference to FIG. 10.

At 1510, the method may include performing a first encoding procedure according to a first portion of the encoding matrix. The operations of 1510 may be performed in accordance with examples as disclosed herein. In some examples, aspects of the operations of 1510 may be performed by an encoder component 1035 as described with reference to FIG. 10.

At 1515, the method may include performing a second encoding procedure on an output of the first encoding procedure according to a second portion of the encoding matrix. The operations of 1515 may be performed in accordance with examples as disclosed herein. In some examples, aspects of the operations of 1515 may be performed by an encoder component 1035 as described with reference to FIG. 10.

At 1520, the method may include transmitting an encoded message based on an output of the first encoding procedure and an output of the second encoding procedure. The operations of 1520 may be performed in accordance with examples as disclosed herein. In some examples, aspects of the operations of 1520 may be performed by an encoder component 1035 as described with reference to FIG. 10.

The following provides an overview of aspects of the present disclosure:

Aspect 1: A method for wireless communications at a UE, comprising: generating an encoding matrix comprising a set of information columns comprising systematic bits, a first set of core parity columns comprising a first set of parity bits, and one or more sets of extension parity columns comprising a second set of parity bits; puncturing one or more of the systematic bits with the first set of parity bits, the second set of parity bits, or a combination thereof, based at least in part on an offset value indicating an initial column of the encoding matrix; and encoding an initial message in accordance with the encoding matrix based at least in part on the offset indicating the initial column of the encoding matrix.

Aspect 2: The method of aspect 1, further comprising: transmitting the encoded initial message, the encoded initial message comprising a RV of the encoding matrix corresponding to the first set of parity bits or the second set of parity bits according to the offset value, wherein the encoded initial message does not include the systematic bits.

Aspect 3: The method of aspect 2, further comprising: initiating transmission of the RV of the encoding matrix according to the puncturing and encoding, an initial bit of the RV corresponding to a first column of the first set of core parity columns.

Aspect 4: The method of any of aspects 2, further comprising: initiating transmission of the RV of the encoding matrix according to the puncturing and encoding, an initial bit of the RV comprising a first occurring degree one extension parity bit of the first set of parity bits or the second set of parity bits.

Aspect 5: The method of aspect 4, wherein the first occurring degree one extension parity bit comprises a special extension parity bit connecting the initial bit of the RV to the punctured one or more systematic bits.

Aspect 6: The method of any of aspects 2, further comprising: initiating transmission of the RV of the encoding matrix according to the puncturing and encoding, an initial bit of the RV comprising a second occurring degree one extension parity bit of the first set of parity bits or the second set of parity bits.

Aspect 7: The method of any of aspects 2 through 6, wherein a first RV of a set of RVs of the encoding matrix corresponds to the set of information columns, and the RV of the encoding matrix comprises a second RV of the set of RVs that does not include the set of information columns.

Aspect 8: The method of any of aspects 1 through 7, wherein the offset value indicating the initial column of the encoding matrix is based at least in part on an entropy of the initial message exceeding an entropy threshold, and the initial column comprises one of the information columns of the set of information columns, or a core parity column of the first set of core parity columns, or an extension parity column of the one or more sets of extension parity columns based at least in part on the entropy of the initial message.

Aspect 9: The method of any of aspects 1 through 8, further comprising: receiving control signaling indicating a sequence of RVs of an initial transmission according to a circular buffer corresponding to the encoding matrix, wherein an initial RV of the sequence of RVs does not include the set of information columns.

Aspect 10: The method of aspect 9, wherein a second RV of the sequence of RVs includes the set of information columns, the second RV occurring in the sequence of RVs after the first set of core parity columns and the one or more sets of extension parity columns have been transmitted via a first RV and one or more additional RVs according to the circular buffer.

Aspect 11: The method of aspect 10, wherein no RVs in the sequence of RVs includes the set of information columns.

Aspect 12: The method of any of aspects 10 through 11, wherein the control signaling comprises an indication of the offset value, an indication of an index of the initial column of the encoding matrix with reference to the circular buffer, an indication of a final index of the first RV with reference to the circular buffer, or any combination thereof.

Aspect 13: The method of any of aspects 1 through 12, further comprising: selecting, a subset of parity bits of the first set of parity bits, the second set of parity bits, or both, wherein the encoding is based at least in part on the subset of parity bits.

Aspect 14: The method of aspect 13, wherein the selecting is based at least in part on a degree of one or more check nodes associated with the subset of parity bits, an order of the set of information columns comprising the systematic bits, an order of the first set of core parity columns comprising the first set of parity bits, an order of the one or more sets of extension parity columns, or a candidate linear combination of the subset of parity bits, or any combination thereof.

Aspect 15: The method of any of aspects 1 through 14, wherein the initial column of the encoding matrix is associated with the first set of parity bits or the second set of parity bits.

Aspect 16: A method for wireless communications at a UE, comprising: generating an encoding matrix comprising a set of information columns comprising systematic bits, a first set of core parity columns comprising a first set of parity bits, and one or more sets of extension parity columns comprising a second set of parity bits; performing a first encoding procedure according to a first portion of the encoding matrix; performing a second encoding procedure on an output of the first encoding procedure according to a second portion of the encoding matrix; and transmitting an encoded message based at least in part on an output of the first encoding procedure and an output of the second encoding procedure.

Aspect 17: The method of aspect 16, wherein the first encoding procedure comprises a LDPC corresponding to the first systematic bits and the first set of parity bits and the second encoding procedure comprises a LDPC corresponding to the first systematic bits and the first set of parity bits.

Aspect 18: The method of any of aspects 16, wherein the first encoding procedure comprises a LDGM corresponding to the second set of parity bits and the second encoding procedure comprises a LDPC corresponding to the first systematic bits and the first set of parity bits.

Aspect 19: The method of any of aspects 16, wherein the first encoding procedure comprises a LDPC corresponding to the first systematic bits and the first set of parity bits and the second encoding procedure comprises a LDGM corresponding to the second set of parity bits.

Aspect 20: A UE for wireless communications, comprising one or more memories storing processor-executable code, and one or more processors coupled with the one or more memories and individually or collectively operable to execute the code to cause the UE to perform a method of any of aspects 1 through 15.

Aspect 21: A UE for wireless communications, comprising at least one means for performing a method of any of aspects 1 through 15.

Aspect 22: A non-transitory computer-readable medium storing code for wireless communications, the code comprising instructions executable by one or more processors to perform a method of any of aspects 1 through 15.

Aspect 23: A UE for wireless communications, comprising one or more memories storing processor-executable code, and one or more processors coupled with the one or more memories and individually or collectively operable to execute the code to cause the UE to perform a method of any of aspects 16 through 19.

Aspect 24: A UE for wireless communications, comprising at least one means for performing a method of any of aspects 16 through 19.

Aspect 25: A non-transitory computer-readable medium storing code for wireless communications, the code comprising instructions executable by one or more processors to perform a method of any of aspects 16 through 19.

It should be noted that the methods described herein describe possible implementations. The operations and the steps may be rearranged or otherwise modified and other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed using a general-purpose processor, a DSP, an ASIC, a CPU, a graphics processing unit (GPU), a neural processing unit (NPU), an FPGA or other programmable logic device, discrete gate or transistor logic, discrete hardware components, or any combination thereof designed to perform the functions described herein. A general-purpose processor may be a microprocessor but, in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Any functions or operations described herein as being capable of being performed by a processor may be performed by multiple processors that, individually or collectively, are capable of performing the described functions or operations.

The functions described herein may be implemented using hardware, software executed by a processor, firmware, or any combination thereof. If implemented using software executed by a processor, the functions may be stored as or transmitted using one or more instructions or code of a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one location to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk, and Blu-ray disc. Disks may reproduce data magnetically, and discs may reproduce data optically using lasers. Combinations of the above are also included within the scope of computer-readable media. Any functions or operations described herein as being capable of being performed by a memory may be performed by multiple memories that, individually or collectively, are capable of performing the described functions or operations.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

As used herein, including in the claims, the article "a" before a noun is open-ended and understood to refer to "at least one" of those nouns or "one or more" of those nouns. Thus, the terms "a," "at least one," "one or more," and "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

The term "determine" or "determining" encompasses a variety of actions and, therefore, "determining" can include calculating, computing, processing, deriving, investigating, looking up (such as via looking up in a table, a database, or another data structure), ascertaining, and the like. Also, "determining" can include receiving (e.g., receiving information), accessing (e.g., accessing data stored in memory), and the like. Also, "determining" can include resolving, obtaining, selecting, choosing, establishing, and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label or other subsequent reference label.

The description set forth herein, in connection with the appended drawings, describes example configurations and does not represent all the examples that may be implemented or that are within the scope of the claims. The term "example" used herein means "serving as an example, instance, or illustration" and not "preferred" or "advantageous over other examples." The detailed description includes specific details for the purpose of providing an understanding of the described techniques. These techniques, however, may be practiced without these specific details. In some figures, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A user equipment (UE), comprising:

one or more memories storing processor-executable code; and one or more processors coupled with the one or more memories and individually or collectively operable to execute the code to cause the UE to:

generate an encoding matrix comprising a set of information columns comprising systematic bits, a first set of core parity columns comprising a first set of parity bits, and one or more sets of extension parity columns comprising a second set of parity bits;

puncture one or more of the systematic bits with the first set of parity bits, the second set of parity bits, or a combination thereof, based at least in part on an offset value indicating an initial column of the encoding matrix; and encode an initial message in accordance with the encoding matrix based at least in part on the offset value indicating the initial column of the encoding matrix.

2. The UE of claim 1, wherein the one or more processors are individually or collectively further operable to execute the code to cause the UE to:

transmit the encoded initial message, the encoded initial message comprising a redundancy version of the encoding matrix corresponding to the first set of parity bits or the second set of parity bits according to the offset value, wherein the encoded initial message does not include the systematic bits.

3. The UE of claim 2, wherein the one or more processors are individually or collectively further operable to execute the code to cause the UE to:

initiate transmission of the redundancy version of the encoding matrix according to the puncturing and encoding, an initial bit of the redundancy version corresponding to a first column of the first set of core parity columns.

4. The UE of claim 2, wherein the one or more processors are individually or collectively further operable to execute the code to cause the UE to:

initiate transmission of the redundancy version of the encoding matrix according to the puncturing and encoding, an initial bit of the redundancy version comprising a first occurring degree one extension parity bit of the first set of parity bits or the second set of parity bits.

5. The UE of claim 4, wherein the first occurring degree one extension parity bit comprises a special extension parity bit connecting the initial bit of the redundancy version to the punctured one or more systematic bits.

6. The UE of claim 2, wherein the one or more processors are individually or collectively further operable to execute the code to cause the UE to:

initiate transmission of the redundancy version of the encoding matrix according to the puncturing and encoding, an initial bit of the redundancy version comprising a second occurring degree one extension parity bit of the first set of parity bits or the second set of parity bits.

7. The UE of claim 2, wherein:

a first redundancy version of a set of redundancy versions of the encoding matrix corresponds to the set of information columns, and the redundancy version of the encoding matrix comprises a second redundancy version of the set of redundancy versions that does not include the set of information columns.

8. The UE of claim 1, wherein the offset value indicating the initial column of the encoding matrix is based at least in part on an entropy of the initial message exceeding an entropy threshold, and wherein the initial column comprises one of the information columns of the set of information columns, or a core parity column of the first set of core parity columns, or an extension parity column of the one or more sets of extension parity columns based at least in part on the entropy of the initial message.

9. The UE of claim 1, wherein the one or more processors are individually or collectively further operable to execute the code to cause the UE to:

receive control signaling indicating a sequence of redundancy versions of an initial transmission according to a circular buffer corresponding to the encoding matrix, wherein an initial redundancy version of the sequence of redundancy versions does not include the set of information columns.

10. The UE of claim 9, wherein a second redundancy version of the sequence of redundancy versions includes the set of information columns, the second redundancy version occurring in the sequence of redundancy versions after the first set of core parity columns and the one or more sets of extension parity columns have been transmitted via a first redundancy version and one or more additional redundancy versions according to the circular buffer.

11. The UE of claim 10, wherein no redundancy versions in the sequence of redundancy versions includes the set of information columns.

12. The UE of claim 10, wherein the control signaling comprises an indication of the offset value, an indication of an index of the initial column of the encoding matrix with reference to the circular buffer, an indication of a final index of the first redundancy version with reference to the circular buffer, or any combination thereof.

13. The UE of claim 1, wherein the one or more processors are individually or collectively further operable to execute the code to cause the UE to:

select, a subset of parity bits of the first set of parity bits, the second set of parity bits, or both, wherein the encoding is based at least in part on the subset of parity bits.

14. The UE of claim 13, wherein the selecting is based at least in part on a degree of one or more check nodes associated with the subset of parity bits, an order of the set of information columns comprising the systematic bits, an order of the first set of core parity columns comprising the first set of parity bits, an order of the one or more sets of extension parity columns, or a candidate linear combination of the subset of parity bits, or any combination thereof.

15. The UE of claim 1, wherein the initial column of the encoding matrix is associated with the first set of parity bits or the second set of parity bits.

16. A method for wireless communications at a user equipment (UE), comprising:

generating an encoding matrix comprising a set of information columns comprising systematic bits, a first set of core parity columns comprising a first set of parity bits, and one or more sets of extension parity columns comprising a second set of parity bits;

puncturing the one or more systematic bits with the first set of parity bits, the second set of parity bits, or a combination thereof, based at least in part on an offset value indicating an initial column of the encoding matrix; and encoding an initial message in accordance with the encoding matrix based at least in part on the offset value indicating the initial column of the encoding matrix.

17. The method of claim 16, further comprising:

transmitting the encoded initial message, the encoded initial message comprising a redundancy version of the encoding matrix corresponding to the first set of parity bits or the second set of parity bits according to the offset value, wherein the encoded initial message does not include the systematic bits.

18. The method of claim 17, further comprising:

initiating transmission of the redundancy version of the encoding matrix according to the puncturing and encoding, an initial bit of the redundancy version corresponding to a first column of first set of core parity columns.

19. The method of claim 17, further comprising:

initiating transmission of the redundancy version of the encoding matrix according to the puncturing and encoding, an initial bit of the redundancy version comprising a first occurring degree one extension parity bit of the first set of parity bits or the second set of parity bits.

20. The method of claim 19, wherein the first occurring degree one extension parity bit comprises a special extension parity bit connecting the initial bit of the redundancy version to the one or more punctured systematic bits.

21. The method of claim 17, further comprising:

initiating transmission of the redundancy version of the encoding matrix according to the puncturing and encoding, an initial bit of the redundancy version comprising a second occurring degree one extension parity bit of the first set of parity bits or the second set of parity bits.

22. The method of claim 17, wherein:

a first redundancy version of a set of redundancy versions of the encoding matrix corresponds to the set of information columns, and the redundancy version of the encoding matrix comprises a second redundancy version of the set of redundancy versions that does not include the set of information columns.

23. The method of claim 16, wherein the offset value indicating the initial column of the encoding matrix is based at least in part on an entropy of the initial message exceeding an entropy threshold, and wherein the initial column comprises one of the information columns of the set of information columns, or a core parity column of the first set of core parity columns, or an extension parity column of the one or more sets of extension parity columns based at least in part on the entropy of the initial message.

24. The method of claim 16, further comprising:

receiving control signaling indicating a sequence of redundancy versions of an initial transmission according to a circular buffer corresponding to the encoding matrix, wherein an initial redundancy version of the sequence of redundancy versions does not include the set of information columns.

25. The method of claim 16, wherein the initial column of the encoding matrix is associated with the first set of parity bits or the second set of parity bits.

* * * * *